US012805252B2

(12) United States Patent
Woo

(10) Patent No.: US 12,805,252 B2
(45) Date of Patent: Nov. 17, 2026

(54) WAFER STORAGE CONTAINER

(71) Applicants: Bum Je Woo, Seongnam-si (KR); PICO & TERA CO., LTD., Suwon-si (KR)

(72) Inventor: Bum Je Woo, Seongnam-si (KR)

(73) Assignees: Bum Je Woo, Seongnam-si (KR); PICO & TERA CO., LTD., Suwon-si (KR)

( * ) Notice: Subject to any disclaimer, the term of this patent is extended or adjusted under 35 U.S.C. 154(b) by 0 days.

(21) Appl. No.: 19/218,285

(22) Filed: May 25, 2025

(65) Prior Publication Data

US 2025/0372425 A1 Dec. 4, 2025

(30) Foreign Application Priority Data

May 28, 2024 (KR) ........................ 10-2024-0069253

(51) Int. Cl.
*H10P 72/10* (2026.01)

(52) U.S. Cl.
CPC ...... *H10P 72/1924* (2026.01); *H10P 72/1922* (2026.01)

(58) Field of Classification Search
CPC .. H10P 72/0402; H10P 72/0468; H10P 72/19; H10P 72/1921; H10P 72/1922; H10P 72/1924; H10P 72/1926; H10P 72/7624; H10P 72/10
USPC .................................................. 206/710, 711
See application file for complete search history.

(56) References Cited

U.S. PATENT DOCUMENTS

| | | | | |
|---|---|---|---|---|
| 10,763,149 B2 * | 9/2020 | Woo | .................... | H10P 72/1924 |
| 10,937,677 B2 * | 3/2021 | Woo | .................... | H10P 72/1926 |
| 11,075,100 B2 * | 7/2021 | Woo | .................... | H10P 72/1922 |
| 11,355,371 B2 * | 6/2022 | Woo | .................... | H10P 72/1926 |
| 11,984,336 B2 * | 5/2024 | Woo | .................... | H10P 72/1921 |
| 2023/0286742 A1 * | 9/2023 | Woo | .................... | H10P 72/1924 |

FOREIGN PATENT DOCUMENTS

| | | |
|---|---|---|
| KR | 101637498 B1 | 7/2016 |
| KR | 20240010796 A | 1/2024 |

OTHER PUBLICATIONS

Title of the Item: Notice of Submission of Opinions of KR 10-2024-0069253Publication Date: Mar. 24, 2025Applicant: Woo Beom-je.

* cited by examiner

*Primary Examiner* — Bryon P Gehman
(74) *Attorney, Agent, or Firm* — Nitin Kaushik

(57) ABSTRACT

The present invention relates to a wafer storage container for supplying purge gas to wafers stored in a storage chamber to remove fumes from the wafers or control the humidity of the wafers. In particular, the invention relates to a wafer storage container that divides the interior of the storage chamber into a plurality of storage regions through a plurality of blocking plates, thereby restricting the vertical flow of fumes and purge gas to minimize contamination inside the storage chamber and enabling purging of wafers in the desired storage region.

9 Claims, 14 Drawing Sheets

WAFER STORAGE CONTAINER

CROSS-REFERENCE TO RELATED APPLICATIONS

The present application claims priority to Korean Patent Application No. 10-2024-0069253, filed May 28, 2024, the entire contents of which is incorporated herein for all purposes by this reference.

TECHNICAL FIELD

The present invention relates to a wafer storage container for supplying purge gas to wafers stored in a storage chamber to remove fumes from the wafers or to control the humidity of the wafers.

BACKGROUND

In general, semiconductor devices are manufactured by selectively and repeatedly performing processes such as deposition, polishing, photolithography, etching, ion implantation, cleaning, inspection, and heat treatment on a wafer, and the wafer is transported to specific locations required for each process to be formed into semiconductor devices.

The wafer, being a high-precision item, is stored or transported in a wafer storage container such as a Front Opening Unified Pod (FOUP) to prevent contamination or damage from external pollutants and impacts.

In this case, process gases used in the process and fumes, which are by-products of the process, remain on the wafer surface without being removed. As a result, contamination of semiconductor manufacturing equipment during the process or defects in the etching pattern of the wafer may occur, leading to a decrease in the reliability of the wafer.

Recently, to solve such problems, purging technologies have been developed to supply purge gas to wafers stored in wafer storage containers, thereby removing fumes remaining on the wafer surface or preventing oxidation of the wafer.

As described above, a wafer storage container capable of supplying purge gas is disclosed in Korean Patent No. 10-1637498 (hereinafter referred to as "Patent Document 1").

The wafer storage container of Patent Document 1 comprises a storage chamber in which wafers are stored, a first gas injection chamber in communication with the storage chamber, a first partition wall that separates the storage chamber and the first gas injection chamber into independent and separate spaces while forming multiple first holes through which gas communicates, a second gas injection chamber in communication with the storage chamber, a second partition wall that separates the storage chamber and the second gas injection chamber into independent and separate spaces while forming multiple second holes through which gas communicates, a gas exhaust chamber in communication with the storage chamber, a third partition wall that separates the storage chamber and the gas exhaust chamber into independent and separate spaces while forming multiple third holes through which gas communicates, and multiple plates supporting the wafers.

Accordingly, the gas introduced into the first and second gas injection chambers is injected into the storage chamber through the first and second holes, respectively, and is exhausted into the gas exhaust chamber through the third holes along with the fumes remaining on the wafer surface, thereby achieving the removal of fumes from the wafer.

However, in the case of the wafer storage container of Patent Document 1, when gas is injected into the storage chamber, the gas flows vertically inside the storage chamber, allowing fumes from heavily contaminated wafers to flow to other wafers, which may increase the contamination level inside the storage chamber.

Additionally, when wafers are present only in a part of the storage chamber, gas is also injected into areas where wafers are not present, resulting in waste of gas.

PRIOR ART DOCUMENTS

Patent Documents (Patent Document 1) Korean Patent No. 10-1637498

SUMMARY

The present invention has been devised to solve the aforementioned problems, and its purpose is to provide a wafer storage container that divides the interior of the storage chamber into a plurality of storage regions through a plurality of blocking plates, thereby restricting the vertical flow of fumes and purge gas to minimize contamination inside the storage chamber, and enabling purging of wafers in the desired storage region.

A wafer storage container according to one aspect of the present invention comprises: a storage chamber in which a plurality of wafers are stored through a front opening; a plurality of support plates provided in a plurality in the vertical direction inside the storage chamber, each supporting each of the plurality of wafers; and a plurality of blocking plates provided between two vertically adjacent support plates among the plurality of support plates, wherein the storage chamber is divided into a plurality of storage regions in the vertical direction by the plurality of blocking plates, and one support plate is located in each of the plurality of storage regions.

In addition, each of the plurality of storage regions is provided with a plurality of injection holes for injecting purge gas into each of the plurality of storage regions, and a plurality of exhaust holes for exhausting the purge gas injected into each of the plurality of storage regions, and the plurality of injection holes and the plurality of exhaust holes are provided on the inner side surface of the storage chamber, but are not located on the same inner side surface.

In addition, the flow of purge gas in the vertical direction is restricted in the plurality of storage regions.

In addition, the distance between the support plate and the blocking plate located above the support plate is shorter than the distance between the support plate and the blocking plate located below the support plate.

In addition, the wafer storage container further comprises a plurality of connecting parts vertically connecting the plurality of support plates and the plurality of blocking plates, wherein each of the plurality of connecting parts includes: a connecting part body; support plate grooves provided in a plurality in the vertical direction on the inner side surface of the connecting part body, into which the outer side surface of the support plate is inserted; and blocking plate grooves provided in a plurality in the vertical direction on the inner side surface of the connecting part body, into which the outer side surface of the blocking plate is inserted.

In addition, the plurality of connecting parts are coupled to the inner side surface of the storage chamber.

In addition, the outer side surface of each of the plurality of support plates and the outer side surface of each of the plurality of blocking plates are in contact with the left side surface, left rear surface, rear surface, right side surface, and right rear surface of the storage chamber, and the area of each of the plurality of blocking plates is formed to be larger than the area of each of the plurality of support plates.

In addition, each of the plurality of storage regions is provided with a plurality of injection holes for injecting purge gas into each of the plurality of storage regions, and the plurality of injection holes are provided on the inner side surface of the storage chamber and located between the support plate and the blocking plate located above the support plate.

A wafer storage container according to another aspect of the present invention comprises: a storage chamber in which a plurality of wafers are stored through a front opening; a plurality of support plates provided in a plurality in the vertical direction inside the storage chamber, each supporting each of the plurality of wafers; and at least one or more blocking plates provided between the plurality of support plates, wherein the storage chamber is divided into a plurality of storage regions in the vertical direction by the blocking plate, and at least two or more support plates are located in at least one of the plurality of storage regions.

According to the wafer storage container of the present invention as described above, the following effects can be achieved.

The storage chamber 100 can be divided into a plurality of storage regions by the blocking plates, allowing the injection and exhaust of purge gas to be performed individually in the plurality of storage regions. Therefore, purging of wafers can be performed only in the region where wafers are stored or in the desired region, thereby saving the consumption of purge gas.

By dividing the storage chamber into independent and individual multiple storage regions, it is possible to prevent purge gas from diffusing into excess spaces inside the storage chamber. Accordingly, the effect of suppressing the reaction of wafers by supplying a minimal amount of purge gas can be achieved.

Since exhaust can be individually performed only in the desired section among the plurality of storage regions, turbulence formed at the front opening where wafers enter can be minimized, thereby improving the efficiency of airflow control.

BRIEF DESCRIPTION OF DRAWINGS

The above and other features of embodiments of the disclosure will become apparent by describing in detail embodiments thereof with reference to the accompanying drawings.

DETAILED DESCRIPTION OF THE EMBODIMENTS

Figure 1:
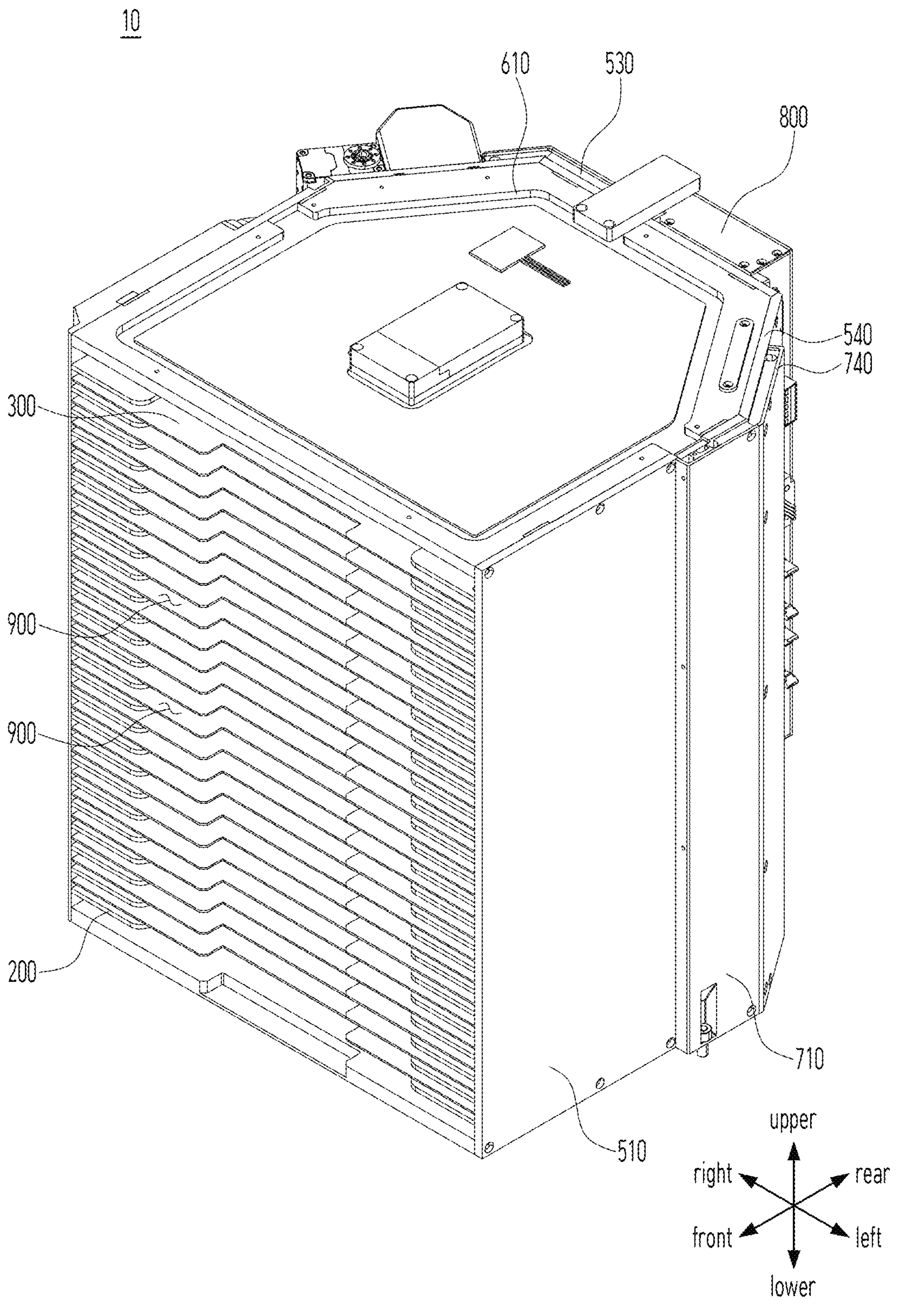
FIGS. 1 to 4 are perspective views of a wafer storage container according to the first embodiment of the present invention.
Figure 2:
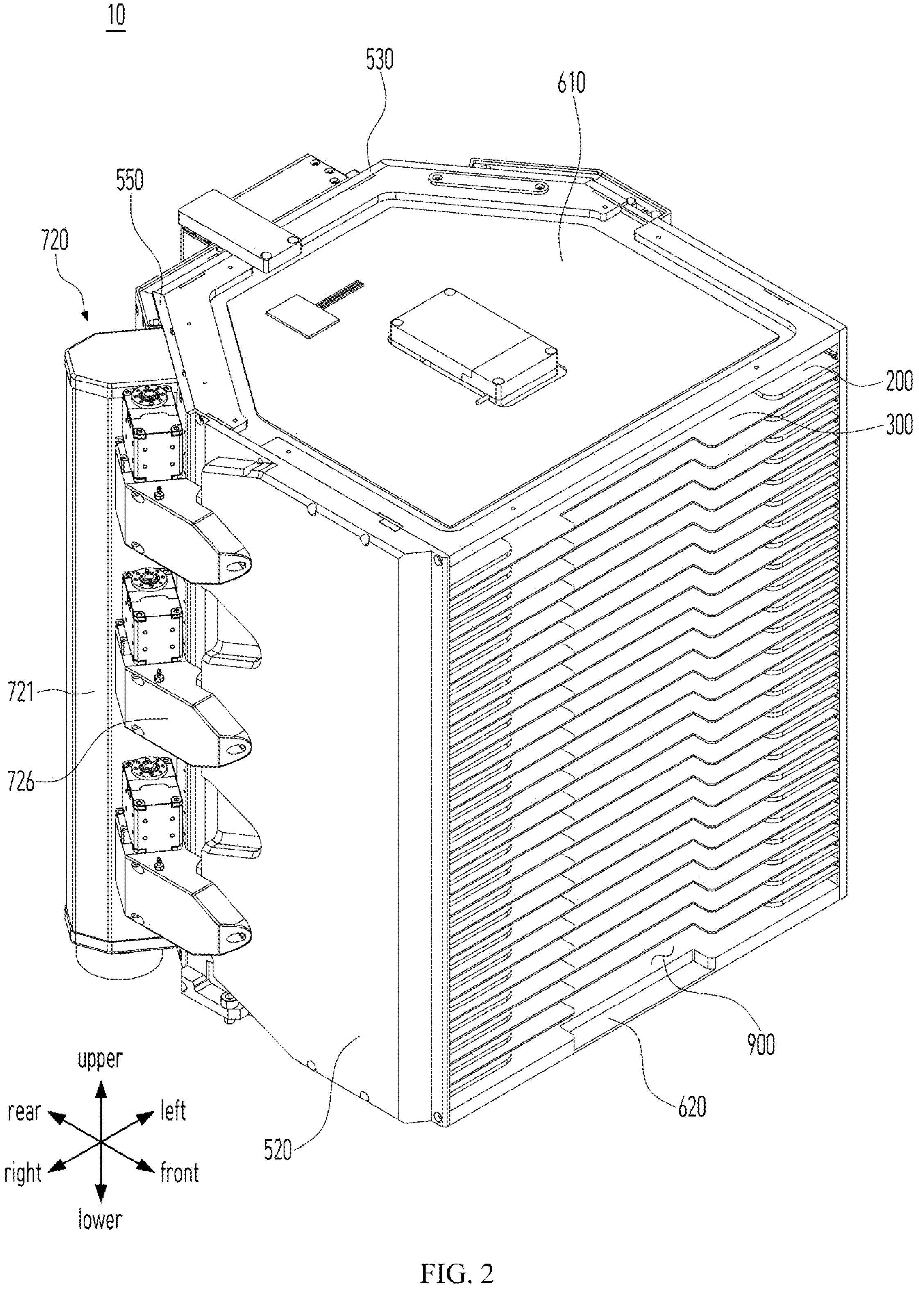

The following content merely illustrates the principles of the invention. Therefore, those skilled in the art can implement the principles of the invention and invent various devices included in the concept and scope of the invention, even if they are not explicitly described or illustrated in this specification. Furthermore, all conditional terms and embodiments listed in this specification are fundamentally intended solely for the purpose of understanding the concept of the invention and should not be understood as being limited to the specifically listed embodiments and conditions.

The aforementioned objectives, features, and advantages will become more apparent through the following detailed description in connection with the accompanying drawings, thereby enabling those skilled in the art to easily implement the technical idea of the invention.

The embodiments described in this specification will be explained with reference to cross-sectional views and/or perspective views, which are ideal illustrations of the invention. The thicknesses of films and regions shown in these drawings are exaggerated for effective explanation of the technical content. The shapes in the illustrations may vary due to manufacturing techniques and/or tolerances. Additionally, the number of metal-formed objects shown in the drawings is illustrative, and only a portion is depicted in the drawings. Therefore, the embodiments of the invention are not limited to the specific forms shown but also include variations in shape generated by the manufacturing process. The technical terms used in this specification are merely employed to describe specific embodiments and are not intended to limit the invention. Singular expressions include plural expressions unless the context clearly indicates otherwise. In this specification, terms such as "comprising" or "having" are intended to specify the presence of features, numbers, steps, operations, components, parts, or combinations thereof described in the specification, and should not be understood as precluding the possibility of the presence or addition of one or more other features, numbers, steps, operations, components, parts, or combinations thereof.

Hereinafter, the preferred embodiments of the invention will be described in detail with reference to the accompanying drawings. In describing various embodiments below, components performing the same function will be given the same names and reference numerals for convenience, even if the embodiments differ. Additionally, the configuration and operation already described in other embodiments will be omitted for convenience.

The term 'purge gas' mentioned below is a generic term for inert gases used to remove fumes from wafers and may particularly be nitrogen ($N_2$) gas, which is one of the inert gases.

Furthermore, 'purging' is a generic term for preventing the oxidation of wafers by spraying purge gas onto the wafer to remove residual fumes on the wafer surface or by removing moisture inside the storage chamber.

Wafer Storage Container 10 According to the First Embodiment of the Invention Hereinafter, with reference to FIGS. 1 to 12, the wafer storage container 10 according to the first embodiment of the invention will be described.

Figure 5:
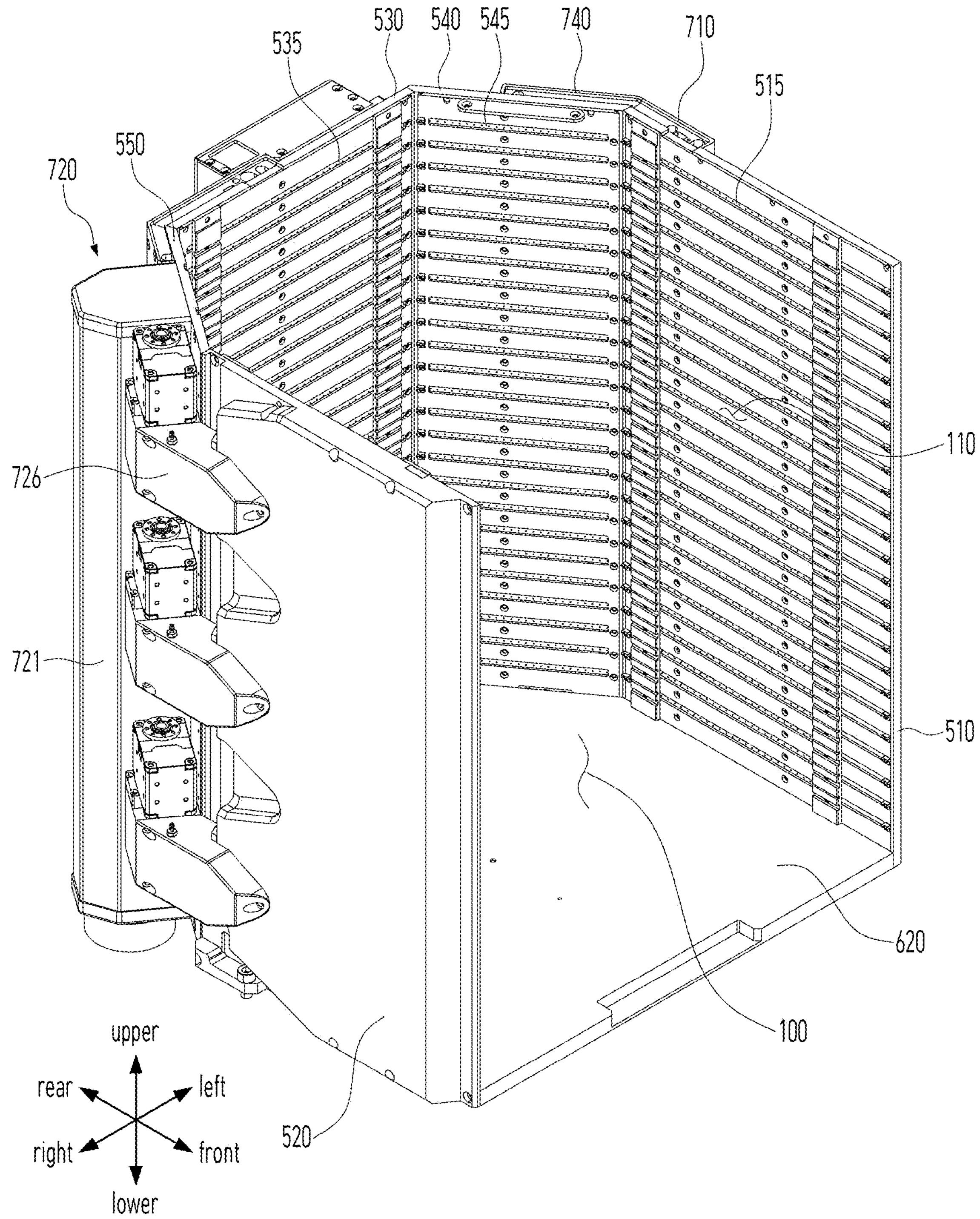
FIG. 5 is a perspective view of the wafer storage container according to the first embodiment of the present invention with the top plate removed.
Figure 6:
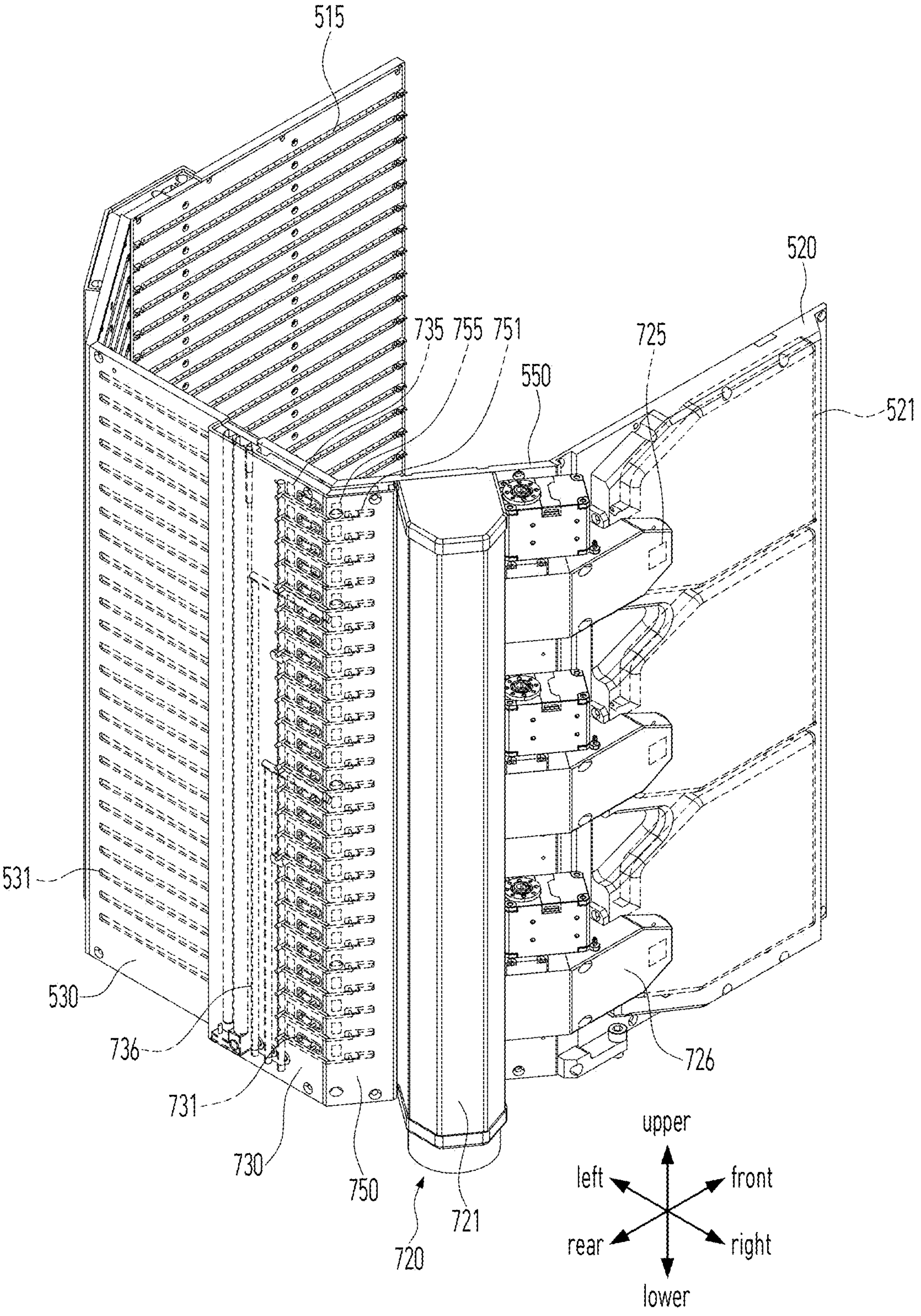
FIGS. 6 and 7 are perspective views of FIG. 5 with the support plates and blocking plates removed.
Figure 7:
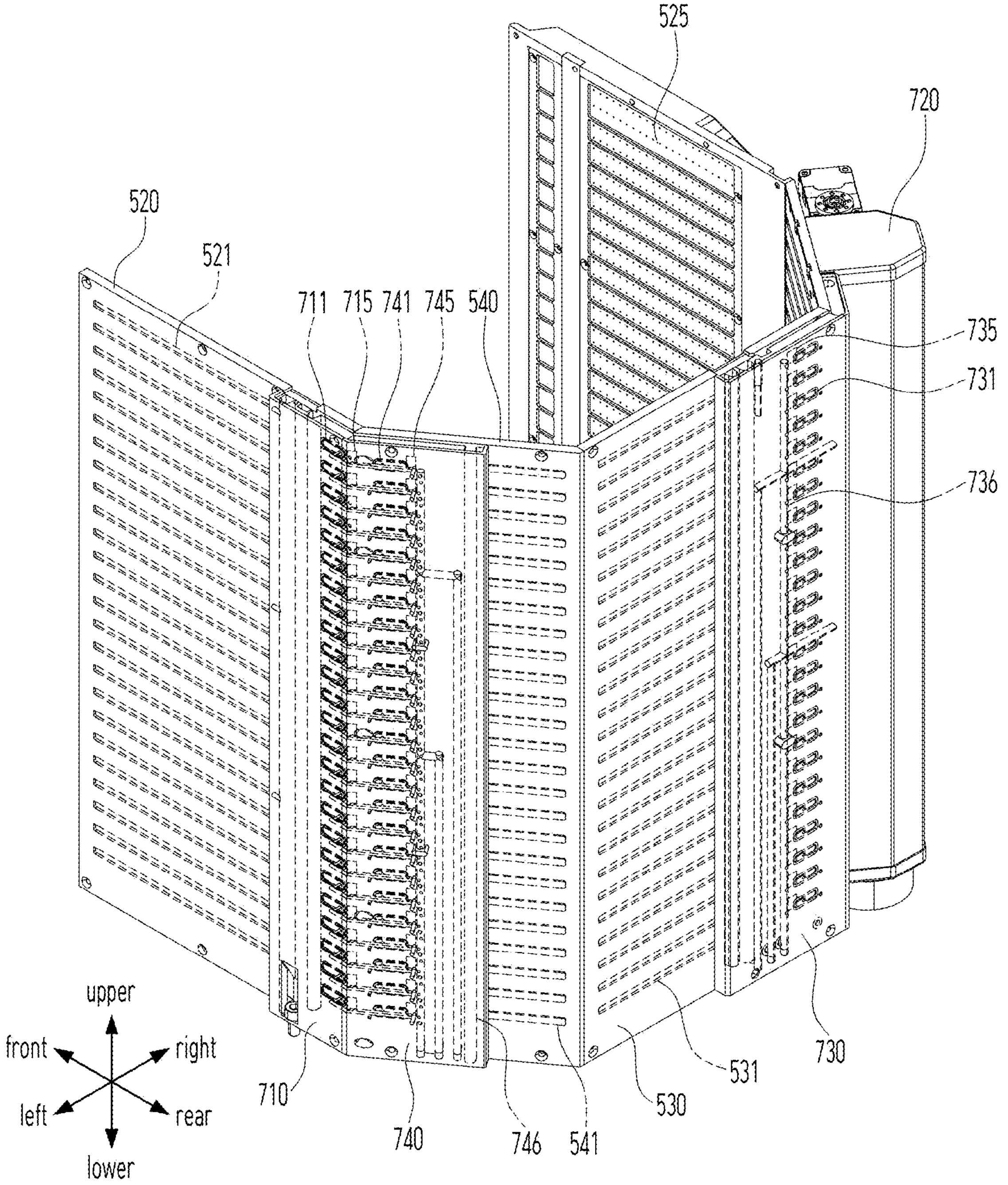
Figure 8:
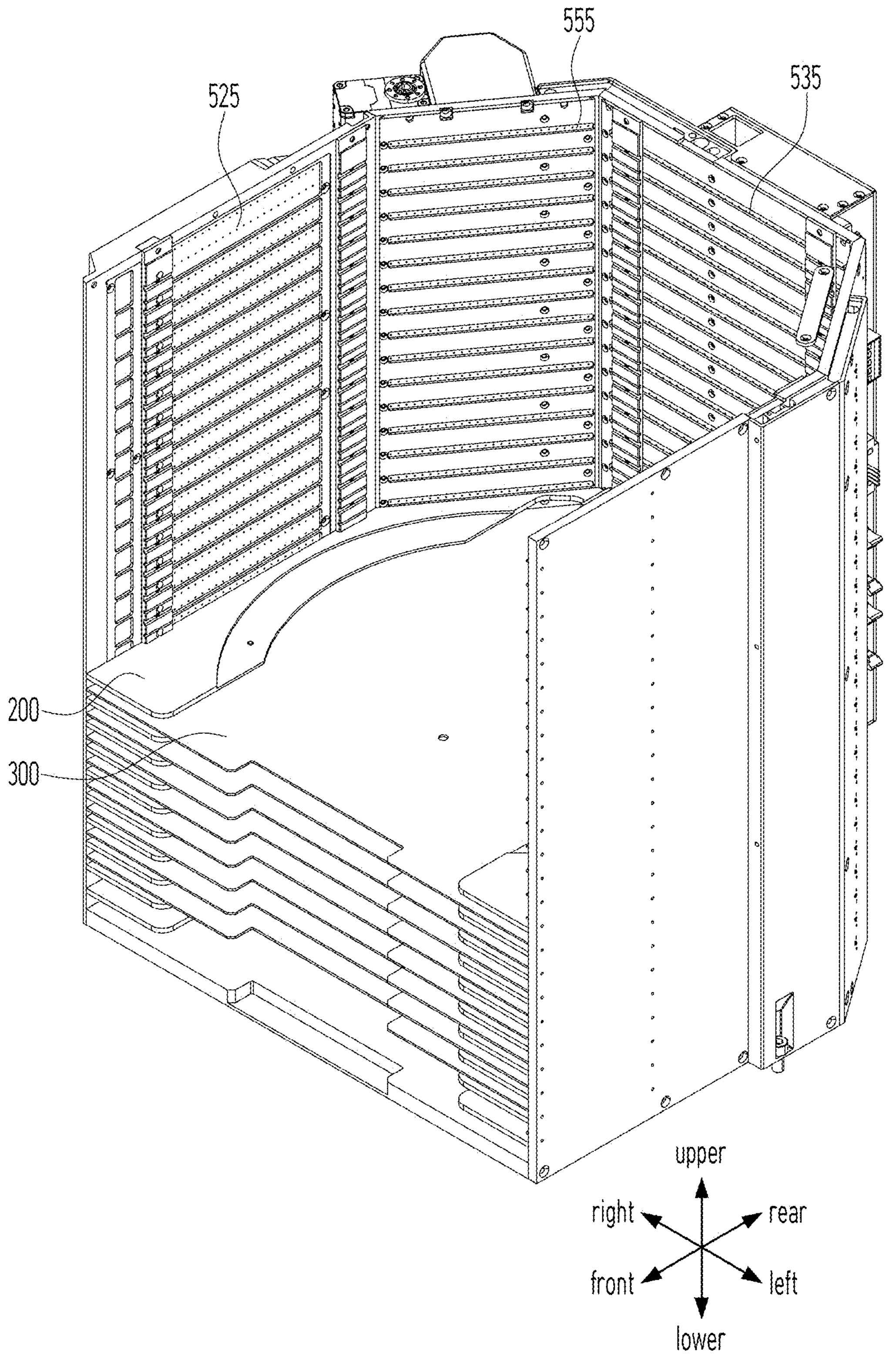
FIG. 8 is a perspective view of FIG. 5 with some support plates and some blocking plates removed.
Figure 9:
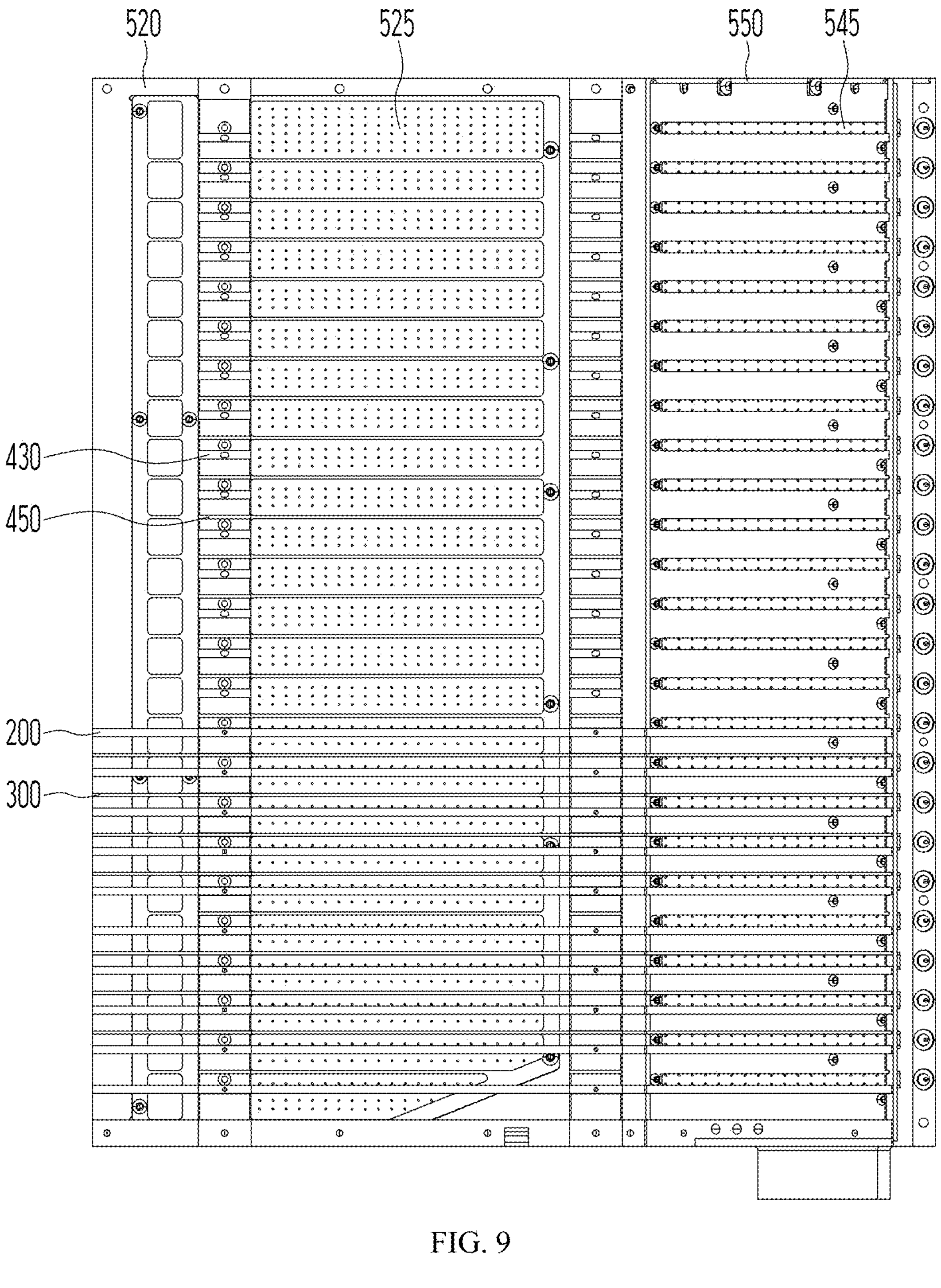
FIGS. 9 and 10 are side views of FIG. 8.
Figure 10:
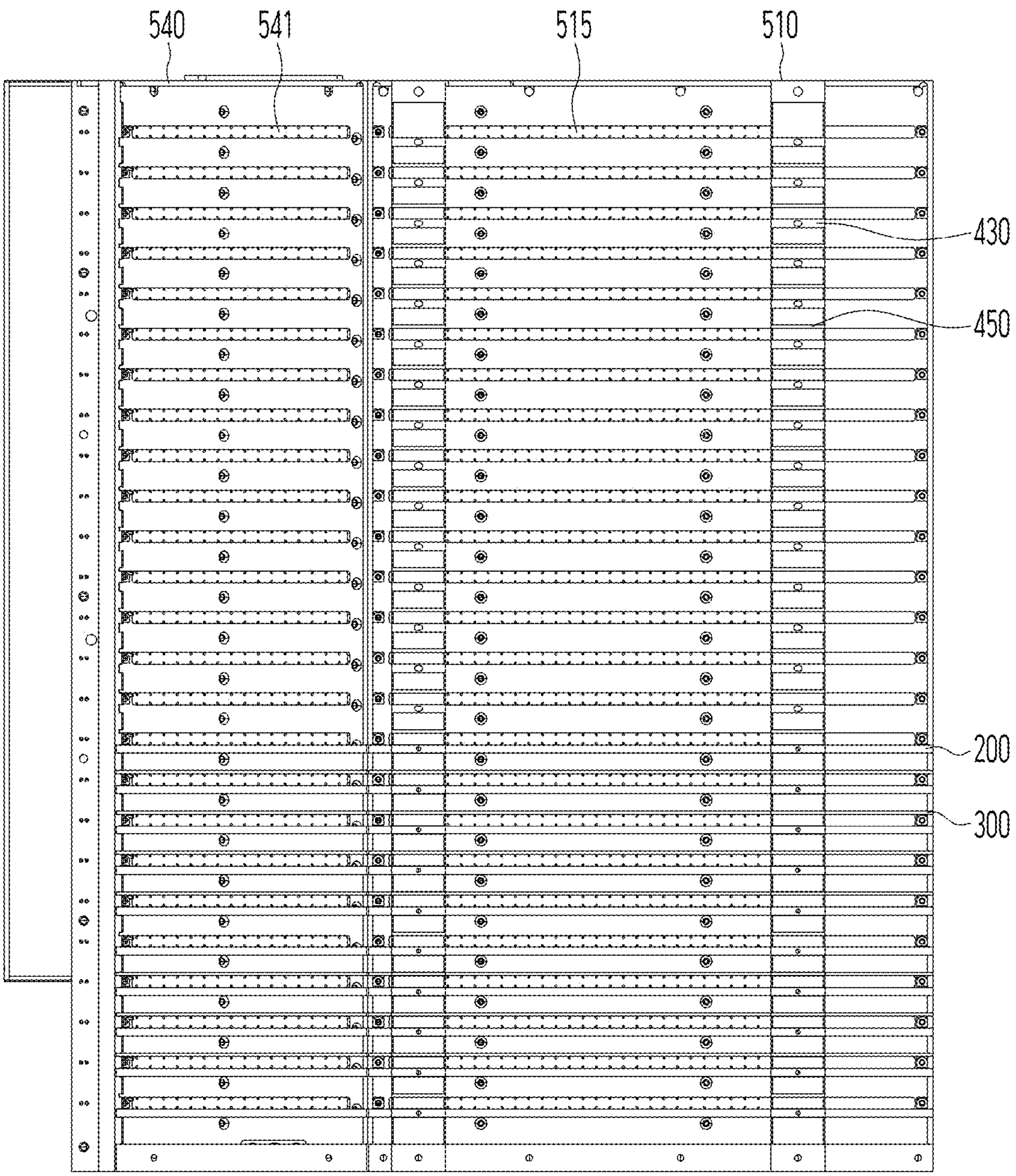
Figure 11:
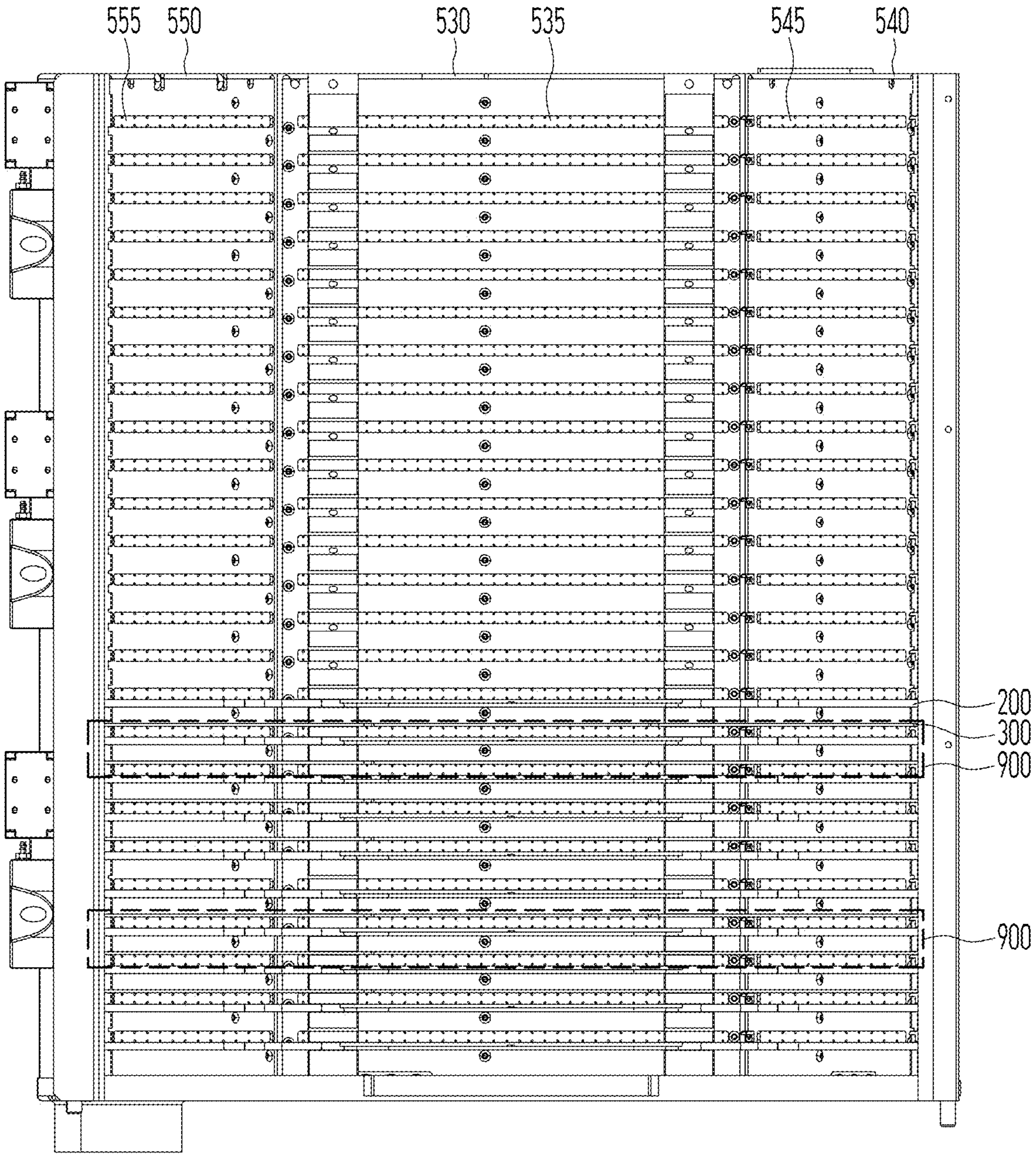
FIG. 11 is a front view of FIG. 8.
Figure 12:
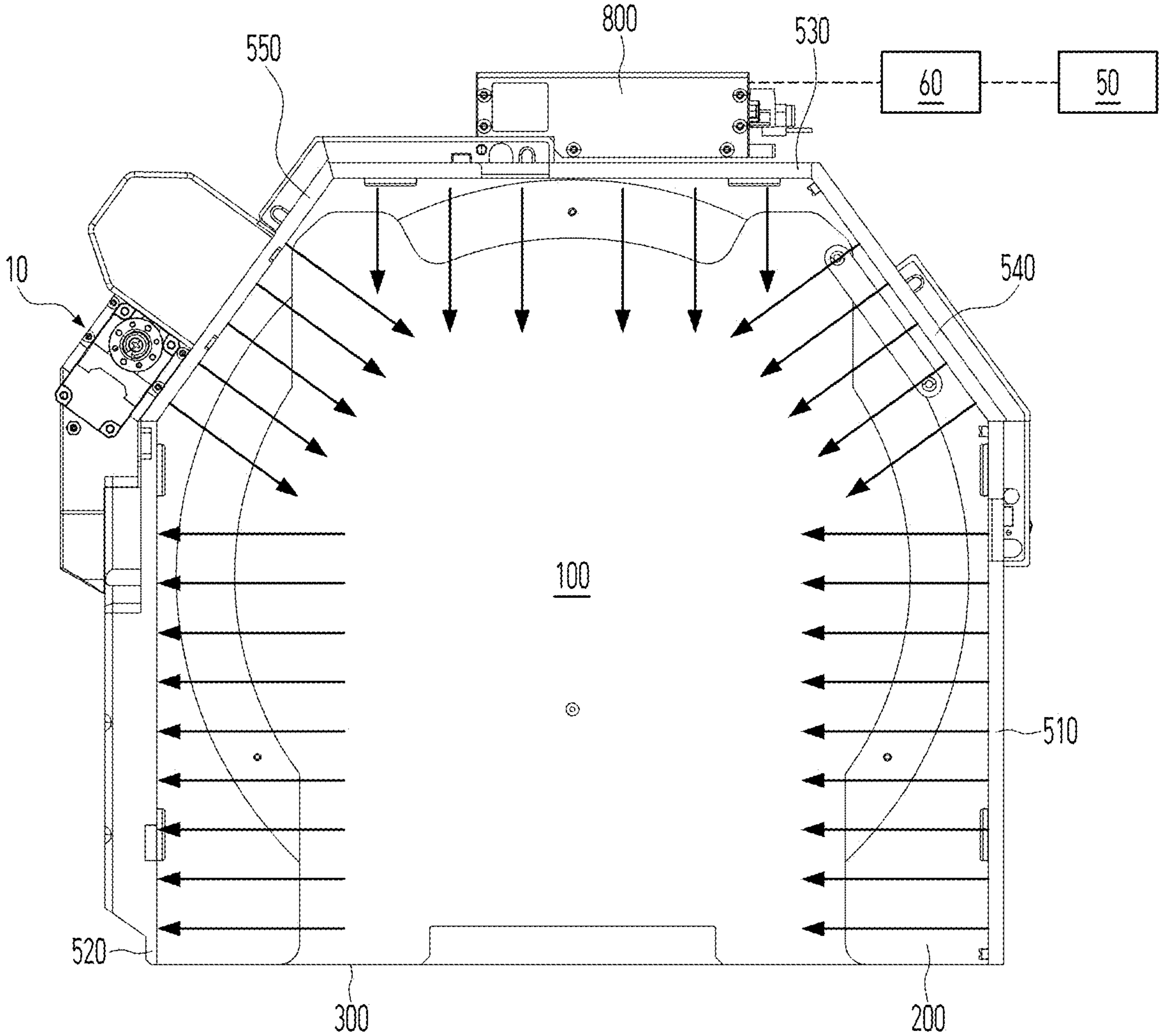
FIG. 12 is a plan view of FIG. 8.

FIGS. 1 to 4 are perspective views of the wafer storage container according to the first embodiment of the invention, FIG. 5 is a perspective view of the wafer storage container with the upper plate removed, FIGS. 6 and 7 are perspective views of FIG. 5 with the support plates and blocking plates removed, FIG. 8 is a perspective view of FIG. 5 with some support plates and some blocking plates removed, FIGS. 9 and 10 are side views of FIG. 8, FIG. 11 is a front view of FIG. 8, and FIG. 12 is a plan view of FIG. 8.

As shown in FIGS. 1 to 10, the wafer storage container 10 according to the first embodiment of the invention comprises:

a storage chamber 100 in which wafers stored through a front opening 110 are housed; a plurality of support plates 200 provided in a plurality in the vertical direction inside the storage chamber 100, each supporting each of the plurality of wafers; a plurality of blocking plates 300 provided between two vertically adjacent support plates 200 among the plurality of support plates 200; a plurality of connecting parts 400 vertically connecting the plurality of support plates 200 and the plurality of blocking plates 300; a left wall 510 forming the left side surface of the storage chamber 100; a plurality of left chambers 511 provided inside the left wall 510 in a plurality in the vertical direction; a plurality of left injection holes 515 provided in the left chambers 511; a right wall 520 forming the right side surface of the storage chamber 100; a plurality of right chambers 521 provided inside the right wall 520 in a plurality in the vertical direction; a plurality of right exhaust holes 525 provided in the right chambers 521; a rear wall 530 forming the rear surface of the storage chamber 100; a plurality of rear chambers 531 provided inside the rear wall 530 in a plurality in the vertical direction; a plurality of rear injection holes 535 provided in the rear chambers 531; a left rear wall 540 connecting the left wall 510 and the rear wall 530 and forming the left rear surface of the storage chamber 100; a plurality of left rear chambers 541 provided inside the left rear wall 540 in a plurality in the vertical direction; a plurality of left rear injection holes 545 provided in the left rear chambers 541; a right rear wall 550 connecting the right wall 520 and the rear wall 530 and forming the right rear surface of the storage chamber 100; a plurality of right rear chambers (the reference number omitted in the drawing) provided inside the right rear wall 550 in a plurality in the vertical direction; a plurality of right rear injection holes 555 provided in the right rear chambers; an upper plate 610 forming the upper surface of the storage chamber 100; a lower plate 630 forming the lower surface of the storage chamber 100; a left supply part 710 coupled to the left side of the left wall 510 and supplying purge gas to the plurality of left chambers 511; a left rear supply part 740 coupled to the left rear of the left rear wall 540 and supplying purge gas to the plurality of left rear chambers 541; a right rear supply part 750 coupled to the right rear of the right rear wall 550 and supplying purge gas to the plurality of right rear chambers; a rear supply part 730 coupled to the rear of the rear wall 530 and supplying purge gas to the plurality of rear chambers 531; and a right exhaust part 720 coupled to the right side of the right wall 520 and providing suction power to the plurality of right chambers 521 to exhaust purge gas through the plurality of right chambers 521.

The storage chamber 100 functions to house wafers inside.

A front opening 110 is provided at the front of the storage chamber 100, and the front of the storage chamber 100 is open.

The storage chamber 100 is defined as an enclosed inner space surrounded by the left wall 510, the left rear wall 540, the rear wall 530, the right rear wall 550, and the right wall 520.

The left wall 510, the left rear wall 540, the rear wall 530, the right rear wall 550, and the right wall 520 form the peripheral surface of the storage chamber 100, excluding the front surface. Wafers are housed inside the storage chamber 100 by entering and exiting through the front opening 110 via a robot arm of an EFEM (Equipment Front End Module) or the like.

The upper surface of the storage chamber 100 is formed by the upper plate 610, and the lower surface of the storage chamber 100 is formed by the lower plate 630.

The peripheral surface of the storage chamber 100 is formed by the left wall 510, the left rear wall 540, the rear wall 530, the right rear wall 550, and the right wall 520.

The left wall 510 forms the left side surface of the storage chamber 100, the left rear wall 540 forms the left rear surface of the storage chamber 100, the rear wall 530 forms the rear surface of the storage chamber 100, the right rear wall 550 forms the right rear surface of the storage chamber 100, and the right wall 520 forms the right side surface of the storage chamber 100.

The storage chamber 100 is closed by the upper plate 700, the lower plate 800, the left wall 510, the left rear wall 540, the rear wall 530, the right rear wall 550, and the right wall 520, except for the front opening 110.

Inside the storage chamber 100, a plurality of support plates 200 are provided to support each of the plurality of wafers.

The support plates 200 are provided in a plurality in the up-down direction, that is, in the vertical direction inside the storage chamber 100, depending on the number of wafers housed in the storage chamber 100. For example, if 30 wafers are to be stored in the storage chamber 100, support plates 200 supporting each of the 30 wafers are provided.

The support plate 200 is provided with a step 210 recessed downward to accommodate the outer edge portion of the wafer, and each step 210 is provided with three protruding pins 220.

Accordingly, the lower surface of the wafer comes into contact with the protruding pins 220, is placed on the protruding pins 220, and is supported by the support plate 200.

As described above, since the wafer is placed on the protruding pins 220 and supported by the support plate 200, the contact area between the wafer and the support plate 200 can be minimized, thereby minimizing damage to the wafer caused by contact.

Recesses 230 are provided on the rear left and right sides of the support plate 200, respectively.

The recesses 230 function to prevent the fingers (not shown) of a robot arm (not shown) from contacting the rear inner surface of the support plate 200 when the wafer is stored in each of the plurality of storage regions 900 by the robot arm. Accordingly, the wafer can be easily stored in each of the plurality of storage regions 900 without contacting the support plate 200.

A plurality of blocking plates 300 are provided between two vertically adjacent support plates 200 among the plurality of support plates 200. Accordingly, the support plates 200 and the blocking plates 300 are alternately arranged vertically.

The blocking plate 300 functions to restrict the vertical flow of purge gas inside the storage chamber 100. Accordingly, the blocking plate 300 has a large area sufficient to almost cover the cross-sectional area of the storage chamber 100 so as to be in contact with the left wall 510, the left rear wall 540, the rear wall 530, the right rear wall 550, and the right wall 520. That is, the cross-sectional area of the storage chamber 100 and the area of the blocking plate 300 are the same or almost similar.

The outer side surface of each of the plurality of support plates 200 and the outer side surface of each of the plurality of blocking plates 300 are in contact with the left wall 510, the left rear wall 540, the rear wall 530, the right wall 520, and the right rear wall 550. Accordingly, the outer side surface of each of the plurality of support plates 200 and the outer side surface of each of the plurality of blocking plates 300 are in contact with the left side surface, left rear surface, rear surface, right side surface, and right rear surface of the storage chamber 100.

The area of each of the plurality of blocking plates 300 is formed to be larger than the area of each of the plurality of support plates 200. Accordingly, the blocking plate 300 can restrict the vertical flow of purge gas inside the storage chamber 100, thereby restricting the vertical flow of purge gas in the plurality of storage regions 900.

Figure 3:
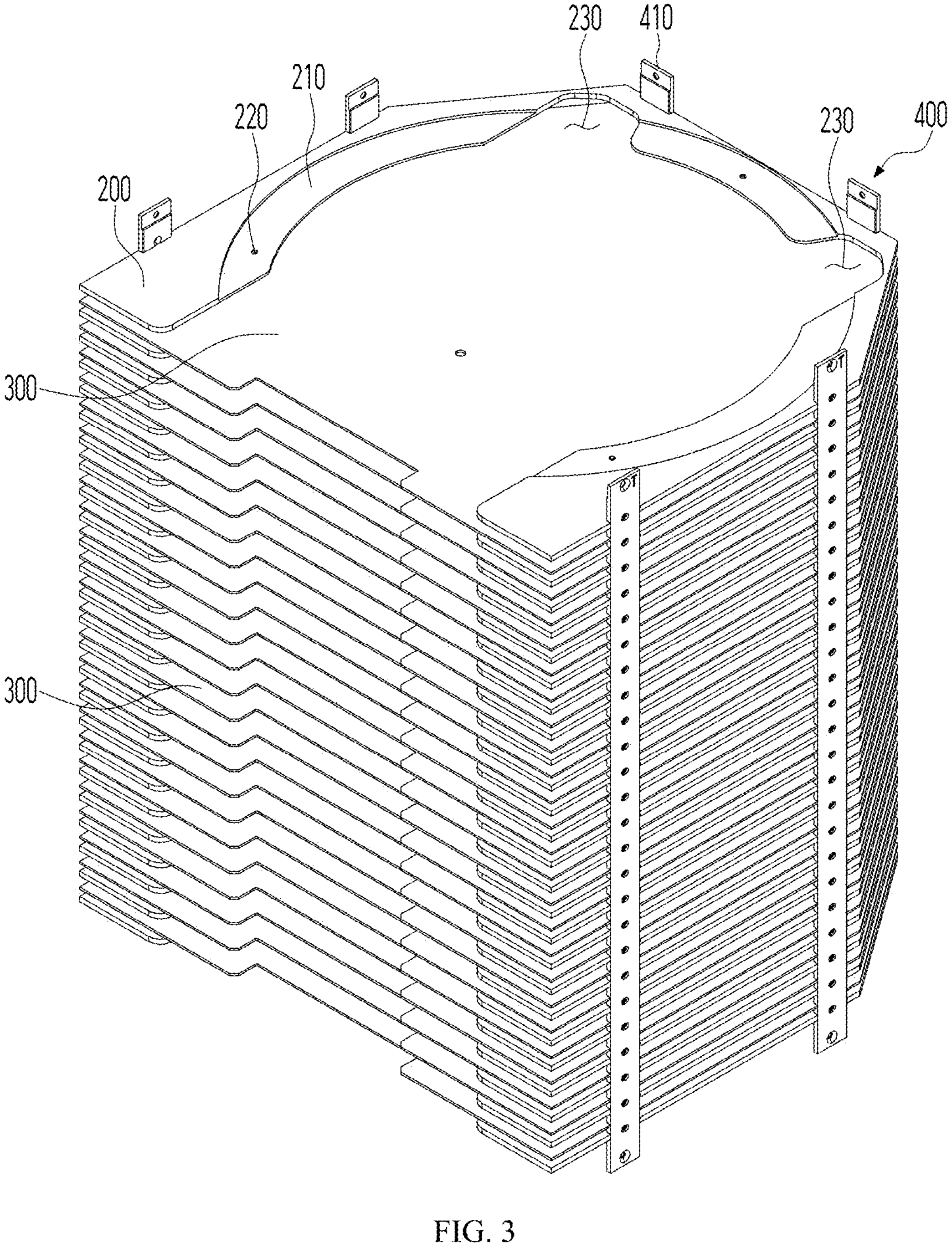
Figure 4:
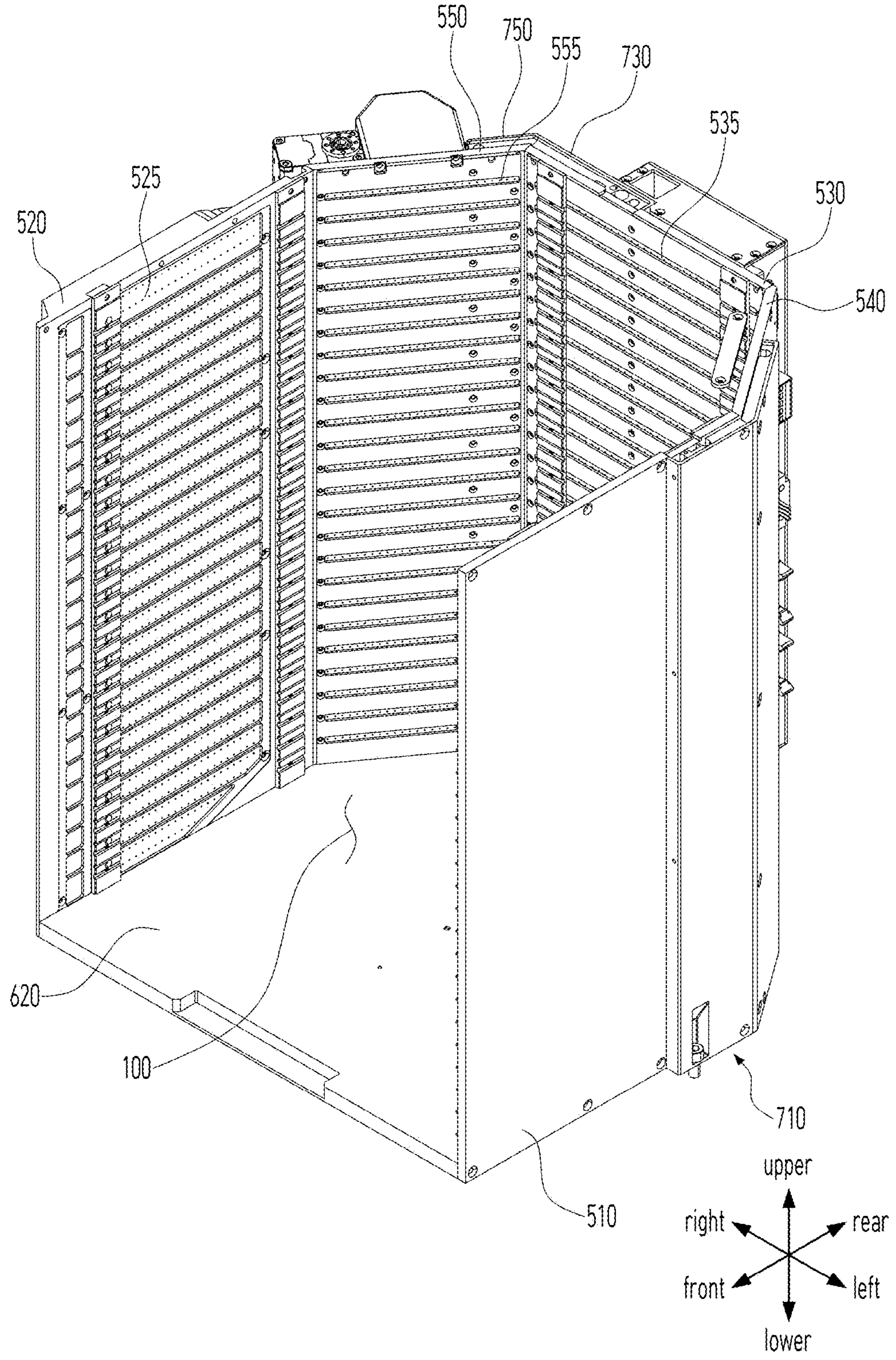

As shown in FIG. 3, the plurality of support plates 200 and the plurality of blocking plates 300 are vertically connected by a plurality of connecting parts 400.

Each of the plurality of connecting parts 400 may include a connecting part body 410 having a length in the up-down direction, support plate grooves 430 provided in a plurality in the up-down direction on the inner side surface of the connecting part body 410 into which the outer side surface of the support plate 200 is inserted, and blocking plate grooves 450 provided in a plurality in the vertical direction on the inner side surface of the connecting part body 410 into which the outer side surface of the blocking plate 300 is inserted.

The plurality of connecting parts 400 are coupled to the inner side surface of the storage chamber 100, that is, the walls surrounding the storage chamber 100.

As an example, the plurality of connecting parts 400 may consist of a total of six connecting parts 400, including two connecting parts 400 coupled to the left wall 510, two connecting parts 400 coupled to the right wall 520, and two connecting parts 400 coupled to the rear wall 530.

The left side surfaces of the plurality of support plates 200 are inserted into the support plate grooves 430 of the two connecting parts 400 coupled to the left wall 510, and the left side surfaces of the plurality of blocking plates 300 are inserted into the blocking plate grooves 450.

As described above, the left side surfaces of the plurality of support plates 200 inserted into the support plate grooves 430 can be fastened to the connecting part body 410 by passing screws through the left side surface of the connecting part body 410. Additionally, the left side surfaces of the plurality of blocking plates 300 inserted into the blocking plate grooves 450 can be fastened to the connecting part body 410 by passing screws through the left side surface of the connecting part body 410.

The right side surfaces of the plurality of support plates 200 are inserted into the support plate grooves 430 of the two connecting parts 400 coupled to the right wall 520, and the right side surfaces of the plurality of blocking plates 300 are inserted into the blocking plate grooves 450.

As described above, the right side surfaces of the plurality of support plates 200 inserted into the support plate grooves 430 can be fastened to the connecting part body 410 by passing screws through the right side surface of the connecting part body 410. Additionally, the right side surfaces of the plurality of blocking plates 300 inserted into the blocking plate grooves 450 can be fastened to the connecting part body 410 by passing screws through the right side surface of the connecting part body 410.

The rear surfaces of the plurality of support plates 200 are inserted into the support plate grooves 430 of the two connecting parts 400 coupled to the rear wall 530, and the rear surfaces of the plurality of blocking plates 300 are inserted into the blocking plate grooves 450. As described above, the rear surfaces of the plurality of support plates 200 inserted into the support plate grooves 430 can be fastened to the connecting part body 410 by passing screws through the rear surface of the connecting part body 410. Additionally, the rear surfaces of the plurality of blocking plates 300 inserted into the blocking plate grooves 450 can be fastened to the connecting part body 410 by passing screws through the rear surface of the connecting part body 410.

After the plurality of connecting parts 400 vertically connect the plurality of support plates 200 and the plurality of blocking plates 300, when the plurality of connecting parts 400 are coupled to the left wall 510, the right wall 520, and the rear wall 530, the plurality of support plates 200 and the plurality of blocking plates 300 can be easily coupled to the left wall 510, the right wall 520, and the rear wall 530. That is, the plurality of connecting parts 400 function to connect at least one of the left wall 510, the right wall 520, the rear wall 530, the left rear wall 540, and the right rear wall 550 with the plurality of support plates 200 and the plurality of blocking plates 300.

The storage chamber 100 is divided into a plurality of storage regions 900 arranged vertically by the plurality of blocking plates 300.

The storage region 900 is partitioned as a space between the blocking plates 300, and one support plate 200 is provided inside one storage region 900. Accordingly, one wafer is located in one storage region 900.

The storage region 900 located at the topmost position among the plurality of storage regions 900 has an upper plate 610 forming the upper surface, a blocking plate 300 forming the lower surface, and the left wall 510, the left rear wall 540, the rear wall 530, the right wall 520, and the right rear wall 550 forming the surrounding surfaces.

The storage region 900 located at the bottommost position among the plurality of storage regions 900 has a blocking plate 300 forming the upper surface, a lower plate 630 forming the lower surface, and the left wall 510, the left rear wall 540, the rear wall 530, the right wall 520, and the right rear wall 550 forming the surrounding surfaces.

The remaining storage regions 900, except for the topmost and bottommost storage regions 900 among the plurality of storage regions 900, have blocking plates 300 forming the upper and lower surfaces, and the left wall 510, the left rear wall 540, the rear wall 530, the right wall 520, and the right rear wall 550 forming the surrounding surfaces.

The distance between any one of the support plates 200 among the plurality of support plates 200 and the blocking plate 300 located above the support plate 200 among the plurality of blocking plates 300 is formed to be shorter than the distance between the support plate 200 and the blocking plate 300 located below the support plate 200.

That is, the support plate 200 provided between two vertically adjacent blocking plates 300 is located above the centerline between the two vertically adjacent blocking plates 300.

Accordingly, the upper region of the support plate 200 in one storage region 900 has a lower height than the lower region of the support plate 200.

As described above, as the lower region of the support plate 200 has a higher height than the upper region of the support plate 200, the vertical movement distance of the robot arm can be secured when the robot arm places the wafer on the support plate 200.

A plurality of left chambers 511 are provided inside the left wall 510.

The plurality of left chambers 511 have a length in the horizontal direction and are arranged in the vertical direction inside the left wall 510.

As described above, it is preferable that the plurality of left chambers 511 arranged in the vertical direction inside the left wall 510 have a number corresponding to the plurality of storage regions 900. For example, if there are 30 storage regions 900, it is preferable that the plurality of left chambers 511 also consist of 30.

A plurality of left injection holes 515 are provided on the inner side surface, that is, the right side surface of the left chambers 511.

A plurality of left rear chambers 541 are provided inside the left rear wall 540.

The plurality of left rear chambers 541 have a length in the horizontal direction and are arranged in the vertical direction inside the left rear wall 540.

As described above, it is preferable that the plurality of left rear chambers 541 arranged in the vertical direction inside the left rear wall 540 have a number corresponding to the plurality of storage regions 900. For example, if there are 30 storage regions 900, it is preferable that the plurality of left rear chambers 541 also consist of 30.

A plurality of left rear injection holes 545 are provided on the inner side surface, that is, the right front surface of the left rear chambers 541.

A plurality of rear chambers 531 are provided inside the rear wall 530.

The plurality of rear chambers 531 have a length in the horizontal direction and are arranged in the vertical direction inside the rear wall 530.

As described above, the plurality of rear chambers 531 arranged in the vertical direction inside the rear wall 530 preferably have a number corresponding to the plurality of storage regions 900. For example, if the plurality of storage regions 900 are 30, it is preferable that the plurality of rear chambers 531 also consist of 30.

On the inner side surface of the rear chamber 531, that is, on the front surface of the rear chamber 531, a plurality of rear injection holes 535 are provided.

Inside the right rear wall 550, a plurality of right rear chambers are provided.

The plurality of right rear chambers have a length in the horizontal direction and are arranged in the vertical direction inside the right rear wall 550.

As described above, the plurality of right rear chambers arranged in the vertical direction inside the right rear wall 550 preferably have a number corresponding to the plurality of storage regions 900. For example, if the plurality of storage regions 900 are 30, it is preferable that the plurality of right rear chambers also consist of 30.

On the inner side surface of the right rear chamber, that is, on the left front surface of the right rear chamber, a plurality of right rear injection holes 555 are provided.

Inside the right wall 520, a plurality of right chambers 521 are provided.

The plurality of right chambers 521 have a length in the horizontal direction and are arranged in the vertical direction inside the right wall 520.

As described above, the plurality of right chambers 521 arranged in the vertical direction inside the right wall 520 preferably have a number corresponding to the plurality of storage regions 900. For example, if the plurality of storage regions 900 are 30, it is preferable that the plurality of right chambers 521 also consist of 30.

On the inner side surface of the right chamber 521, that is, on the left side surface of the right chamber 521, a plurality of right exhaust holes 525 are provided.

Through the aforementioned left injection holes 515, left rear injection holes 545, rear injection holes 535, and right rear injection holes 555, purge gas is injected into the interior of the storage chamber 100 from the left wall 510, left rear wall 540, rear wall 530, and right rear wall 550.

The purge gas injected into the interior of the storage chamber 100 and the fumes of the wafer are exhausted from the storage chamber 100 to the right chamber 521 through the right exhaust holes 525.

Each of the plurality of storage regions 900 is provided with a plurality of injection holes for injecting purge gas into each of the plurality of storage regions 900 and a plurality of exhaust holes for exhausting the purge gas and the fumes of the wafer injected into each of the plurality of storage regions 900.

As shown in FIGS. 4 to 12, in the case of the first embodiment of the present invention, the plurality of injection holes may comprise the plurality of left injection holes 515, the plurality of left rear injection holes 545, the plurality of rear injection holes 535, and the plurality of right rear injection holes 555.

The plurality of injection holes are provided on the inner side surface of the storage chamber 100, that is, on the inner wall, and may be located between any one of the plurality of support plates 200 and the blocking plate 300 located above the support plate 200. That is, the plurality of injection holes may be provided on the inner side surface of the storage chamber 100, that is, on the inner wall, so as to be located in the upper region of the support plate 200 in the storage region 900.

The plurality of injection holes and the plurality of exhaust holes are provided on the inner side surface of the storage chamber 100 but are not located on the same inner side surface. That is, the inner side surface of the storage chamber 100 is provided with only one of the injection holes or the exhaust holes to inject purge gas or exhaust purge gas and fumes.

The plurality of left injection holes 515 are provided on the left side surface in the upper region of the support plate 200 in the storage region 900 so as to be located between any one of the plurality of support plates 200 and the blocking plate 300 located above the support plate 200. These plurality of left injection holes 515 may be provided in a matrix form with a plurality in the vertical and horizontal directions.

In addition, the plurality of left injection holes 515 of the storage region 900 located at the topmost of the plurality of storage regions 900 may be provided on the left side surface in the upper region of the support plate 200 in the storage region 900 so as to be located between the support plate 200 and the upper plate 610 located above the support plate 200.

The matrix form of the plurality of left injection holes 515 communicates with each of the plurality of left chambers 511 and may be formed on the inner side surface, that is, the right side surface, of each of the plurality of left chambers 511.

Therefore, the matrix form of the plurality of left injection holes 515 may be arranged in the vertical direction so as to be located in the left upper region of each of the plurality of support plates 200 arranged vertically.

The plurality of left rear injection holes 545 are provided on the left rear surface in the upper region of the support plate 200 in the storage region 900 so as to be located between any one of the plurality of support plates 200 and the blocking plate 300 located above the support plate 200. These plurality of left rear injection holes 545 may be provided in a matrix form with a plurality in the vertical and horizontal directions.

In addition, the plurality of left rear injection holes 545 of the storage region 900 located at the topmost of the plurality of storage regions 900 may be provided on the left rear surface in the upper region of the support plate 200 in the storage region 900 so as to be located between the support plate 200 and the upper plate 610 located above the support plate 200.

The matrix form of the plurality of left rear injection holes 545 communicates with each of the plurality of left rear chambers 541 and may be formed on the inner side surface, that is, the right front surface, of each of the plurality of left rear chambers 541.

Therefore, the matrix form of the plurality of left rear injection holes 545 may be arranged in the vertical direction so as to be located in the left rear upper region of each of the plurality of support plates 200 arranged vertically.

The plurality of rear injection holes 535 are provided on the rear surface in the upper region of the support plate 200 in the storage region 900 so as to be located between any one of the plurality of support plates 200 and the blocking plate 300 located above the support plate 200. These plurality of rear injection holes 535 may be provided in a matrix form with a plurality in the vertical and horizontal directions.

In addition, the plurality of rear injection holes 535 of the storage region 900 located at the topmost of the plurality of storage regions 900 may be provided on the rear surface in the upper region of the support plate 200 in the storage region 900 so as to be located between the support plate 200 and the upper plate 610 located above the support plate 200.

The matrix form of the plurality of rear injection holes 535 communicates with each of the plurality of rear chambers 531 and may be formed on the inner side surface, that is, the front surface, of each of the plurality of rear chambers 531.

Therefore, the matrix form of the plurality of rear injection holes 535 may be arranged in the vertical direction so as to be located in the rear upper region of each of the plurality of support plates 200 arranged vertically.

The plurality of right rear injection holes 555 are provided on the right rear surface in the upper region of the support plate 200 in the storage region 900 so as to be located between any one of the plurality of support plates 200 and the blocking plate 300 located above the support plate 200. These plurality of right rear injection holes 555 may be provided in a matrix form with a plurality in the vertical and horizontal directions.

In addition, the plurality of right rear injection holes 555 of the storage region 900 located at the topmost of the plurality of storage regions 900 may be provided on the right rear surface in the upper region of the support plate 200 in the storage region 900 so as to be located between the support plate 200 and the upper plate 610 located above the support plate 200.

The matrix form of the plurality of right rear injection holes 555 communicates with each of the plurality of right rear chambers and may be formed on the inner side surface, that is, the left front surface, of each of the plurality of right rear chambers.

Therefore, the matrix form of the plurality of right rear injection holes 555 may be arranged in the vertical direction so as to be located in the right rear upper region of each of the plurality of support plates 200 arranged vertically.

In the case of the first embodiment of the present invention, the plurality of exhaust holes may comprise the plurality of right exhaust holes 525.

The plurality of right exhaust holes 525 are provided on the right side surface of the storage region 900. These plurality of right exhaust holes 525 may be provided in a matrix form with a plurality in the vertical and horizontal directions.

The matrix form of the plurality of right exhaust holes 525 communicates with each of the plurality of right chambers 521 and may be formed on the inner side surface, that is, the left side surface, of each of the plurality of right chambers 521.

Therefore, the plurality of right exhaust holes 525 in a matrix form may be arranged vertically in a plurality so as to be located in each of the right regions of the plurality of support plates 200 arranged vertically.

As described above, the plurality of injection holes provided in the storage region 900 are located in the upper region of the support plate 200, so that the purge gas injected through the plurality of injection holes can push out fumes present on the upper surface of the wafer. Therefore, the removal of fumes from the wafer can be performed more efficiently without wasting purge gas.

In addition, the plurality of injection holes in the storage region 900 are configured to include the left injection hole 515, the left rear injection hole 545, the rear injection hole 535, and the right rear injection hole 555, so that purge gas is injected from the left, left rear, rear, and right rear in the storage region 900, and purge gas and fumes are exhausted from the right of the storage region 900 through the right exhaust hole 525, thereby effectively achieving the removal of fumes from the wafer.

The left supply part 710 is coupled to the left of the left wall 510.

Inside the left supply part 710, a plurality of left supply chambers 711 are arranged in the vertical direction.

The number of the plurality of left supply chambers 711 is the same as the number of the plurality of left chambers 511.

Each of the plurality of left supply chambers 711 communicates with each of the plurality of left chambers 511.

Each of the plurality of left supply chambers 711 is located at a position corresponding to each of the plurality of left chambers 511.

The rear supply part 730 is coupled to the rear of the rear wall 530.

Inside the rear supply part 730, a plurality of rear supply chambers 731 are arranged in the vertical direction.

The number of the plurality of rear supply chambers 731 is the same as the number of the plurality of rear chambers 531.

Each of the plurality of rear supply chambers 731 communicates with each of the plurality of rear chambers 531.

Each of the plurality of rear supply chambers 731 is located at a position corresponding to each of the plurality of rear chambers 531.

Inside the rear supply part 730, a plurality of right vertical supply passages 736 are provided.

The number of the plurality of right vertical supply passages 736 may be the same as the number of the plurality of right horizontal supply passages (not shown) of the lower plate 630. In this case, each of the plurality of right vertical supply passages 736 communicates with each of the plurality of right horizontal supply passages.

The number of the plurality of right vertical supply passages 736 may be equal to or less than the number of the plurality of rear chambers 531.

If the number of the plurality of right vertical supply passages 736 is equal to the number of the plurality of rear chambers 531, each of the plurality of right vertical supply passages 736 communicates with each of the plurality of rear chambers 531.

If the number of the plurality of right vertical supply passages 736 is less than the number of the plurality of rear chambers 531, one right vertical supply passage 736 may communicate with a plurality of rear chambers 531.

For example, if there are 3 right vertical supply passages 736 and 30 rear chambers 531, one right vertical supply passage 736 may communicate with 10 rear chambers 531.

These right vertical supply passages 736 function to flow purge gas introduced from the right horizontal supply passages into the plurality of rear chambers 531.

In addition, each of the plurality of rear chambers 531 communicates with each of the plurality of right rear chambers.

Therefore, the purge gas flows in the order of the right horizontal supply passages, the right vertical supply passages 736, the rear chambers 531, and the right rear chambers, and is injected and supplied into the storage chamber through the rear injection hole 535 and the right rear injection hole 555.

The left rear supply part 740 is coupled to the left rear of the left rear wall 540.

Inside the left rear supply part 740, a plurality of left rear supply chambers 741 are arranged in the vertical direction.

The number of the plurality of left rear supply chambers 741 is the same as the number of the plurality of left rear chambers 541.

Each of the plurality of left rear supply chambers 741 communicates with each of the plurality of left rear chambers 541.

Each of the plurality of left rear supply chambers 741 is located at a position corresponding to each of the plurality of left rear chambers 541.

Inside the left rear supply part 740, a plurality of left vertical supply passages 746 are provided.

The number of the plurality of left vertical supply passages 746 may be the same as the number of the plurality of left horizontal supply passages (not shown) of the lower plate 630. In this case, each of the plurality of left vertical supply passages 746 communicates with each of the plurality of left horizontal supply passages.

The number of the plurality of left vertical supply passages 746 may be equal to or less than the number of the plurality of left rear chambers 541.

If the number of the plurality of left vertical supply passages 746 is equal to the number of the plurality of left rear chambers 541, each of the plurality of left vertical supply passages 746 communicates with each of the plurality of left rear chambers 541.

If the number of the plurality of left vertical supply passages 746 is less than the number of the plurality of left rear chambers 541, one left vertical supply passage 746 may communicate with a plurality of left rear chambers 541.

For example, if there are three left vertical supply passages 746 and thirty left rear chambers 541, one left vertical supply passage 746 may communicate with ten left rear chambers 541.

These left vertical supply passages 746 function to flow purge gas introduced from the left horizontal supply passages into the plurality of left rear chambers 541.

In addition, each of the plurality of left rear chambers 541 communicates with each of the plurality of left chambers 511.

Therefore, the purge gas flows in the order of the left horizontal supply passages, the left vertical supply passages 746, the left rear chambers 541, and the left chambers 511, and is injected and supplied into the storage chamber through the left rear injection hole 545 and the left injection hole 515.

The right exhaust part 720 is coupled to the right of the right wall 520.

The right exhaust part 720 may be configured to include a vertical exhaust chamber 721 provided inside the right exhaust part 720, and a plurality of communication chambers 726 arranged in the vertical direction, which communicate the vertical exhaust chamber 721 with each of the plurality of right chambers 521.

The vertical exhaust chamber 721 communicates with an external exhaust part (not shown) provided outside the wafer storage container 10.

The number of the plurality of communication chambers 726 may be the same as or less than the number of the plurality of right chambers 521.

If the number of the plurality of communication chambers 726 is the same as the number of the plurality of right chambers 521, each of the plurality of communication chambers 726 communicates with each of the plurality of right chambers 521.

If the number of the plurality of communication chambers 726 is less than the number of the plurality of right chambers 521, one communication chamber 726 may communicate with a plurality of right chambers 521.

As an example, in the first embodiment of the present invention, if there are three communication chambers 726 and thirty right chambers 521, one communication chamber 726 communicates with ten right chambers 521.

These communication chambers 726 function to flow purge gas and fumes exhausted into the right chambers 521 through the right exhaust holes 525 into the vertical exhaust chamber 721.

Therefore, the purge gas and fumes inside the storage chamber 100 flow in the order of the right exhaust holes 525, the right chambers 521, the communication chambers 726, the vertical exhaust chamber 721, and the external exhaust part, and are exhausted to the outside of the wafer storage container 10.

A plurality of exhaust valves 725 may be provided in each of the plurality of communication chambers 726 or in each communication section between the plurality of communication chambers 726 and the plurality of right chambers 521.

The exhaust valve 725 functions to provide suction force to the communication chamber 726 and the right chamber 521 by opening and closing, thereby exhausting purge gas and fumes or blocking the exhaust of purge gas and fumes.

The upper plate 610 closes the upper part of the storage chamber 100 and forms the upper surface of the wafer storage container 10 and the storage chamber 100.

The lower plate 630 closes the lower part of the storage chamber 100 and forms the lower surface of the wafer storage container 10 and the storage chamber 100.

The overall shape of the upper plate 610 may be the same as the overall shape of the lower plate 630.

The lower plate 630 is provided inside the lower plate 630 and may comprise a plurality of right horizontal supply passages communicating with each of the plurality of right vertical supply passages 736 of the right rear supply part 750, and a plurality of left horizontal supply passages communicating with each of the plurality of left vertical supply passages 746 of the left rear supply part 740.

The plurality of right horizontal supply passages are in communication with an external purge gas supply part 50 through a plurality of first external gas communication ports (not shown) formed on the lower surface of the lower plate 630, and receive purge gas.

The plurality of left horizontal supply passages are in communication with an external purge gas supply part 50 through a plurality of second external gas communication ports (not shown) formed on the lower surface of the lower plate 630, and receive purge gas. As described above, the lower plate 630 functions to flow the purge gas supplied from the outside of the wafer storage container 10 to the left supply part 710, the left rear supply part 740, the right rear supply part 750, and the rear supply part 730 through the first external gas communication ports (not shown) and the second external gas communication ports (not shown) formed on the lower surface, that is, the bottom surface of the lower plate 630, and the right horizontal supply passages and the left horizontal supply passages formed inside the lower plate 630.

The number of the plurality of left vertical supply passages 746 of the left rear supply part 740, the number of the plurality of left supply chambers 711, the number of the plurality of left rear supply chambers 741, the number of the plurality of right vertical supply passages 736 of the right rear supply part 750, the number of the plurality of right rear supply chambers 751, and the number of the plurality of rear supply chambers 731 may be the same as the number of the plurality of support plates 200 and the number of the plurality of storage regions 900.

As an example, in the first embodiment of the present invention, the number of the plurality of left vertical supply passages 746 of the left rear supply part 740, the number of the plurality of left supply chambers 711, the number of the plurality of left rear supply chambers 741, the number of the plurality of right vertical supply passages 736 of the right rear supply part 750, the number of the plurality of right rear supply chambers 751, the number of the plurality of rear supply chambers 731, the number of the plurality of support plates 200, and the number of the plurality of storage regions 900 are all the same, which is 30.

A plurality of first valves 715 may be provided in the communication sections between the plurality of left rear supply chambers 741 and the plurality of left supply chambers 711.

The plurality of first valves 715 function to supply the purge gas supplied from the plurality of left vertical supply passages 746 to the plurality of left rear supply chambers 741 to each of the plurality of left supply chambers 711, or to block the supply of the purge gas.

Alternatively, the plurality of first valves 715 may be provided in the communication sections between the plurality of left vertical supply passages 746 and each of the plurality of left supply chambers 711. In this case, the plurality of first valves 715 function to supply the purge gas to each of the plurality of left supply chambers 711 through each of the plurality of left vertical supply passages 746, or to block the supply of the purge gas.

Through the plurality of first valves 715 as described above, the supply of purge gas to each of the plurality of left supply chambers 711 arranged vertically can be individually controlled.

Accordingly, the plurality of left injection holes 515 provided on the left side of each of the plurality of storage regions 900 can individually inject purge gas regardless of whether the left injection holes 515 of other storage regions 900 inject purge gas.

A plurality of third valves 745 may be provided in the communication sections between the plurality of left vertical supply passages 746 and each of the plurality of left rear supply chambers 741.

The plurality of third valves 745 function to supply the purge gas to each of the plurality of left rear supply chambers 741 through each of the plurality of left vertical supply passages 746, or to block the supply of the purge gas.

Through the plurality of third valves 745 as described above, the supply of purge gas to each of the plurality of left rear supply chambers 741 arranged vertically can be individually controlled.

Accordingly, the plurality of left rear injection holes 545 provided on the left rear side of each of the plurality of storage regions 900 can individually inject purge gas regardless of whether the left rear injection holes 545 of other storage regions 900 inject purge gas.

A plurality of fourth valves 755 may be provided in the communication sections between the plurality of rear supply chambers 731 and each of the plurality of right rear supply chambers 751.

The plurality of fourth valves 755 function to supply the purge gas supplied from the plurality of right vertical supply passages 736 to the plurality of rear supply chambers 731 to each of the plurality of right rear supply chambers 751, or to block the supply of the purge gas.

Alternatively, the plurality of fourth valves 755 may be provided in the communication sections between the plurality of right vertical supply passages 736 and each of the plurality of right rear supply chambers 751. In this case, the plurality of fourth valves 755 function to supply the purge gas to each of the plurality of right rear supply chambers 751 through each of the plurality of right vertical supply passages 736, or to block the supply of the purge gas.

Through the plurality of fourth valves 755 as described above, the supply of purge gas to each of the plurality of right rear supply chambers 751 arranged vertically can be individually controlled.

Accordingly, the plurality of right rear injection holes 555 provided on the right rear side of each of the plurality of storage regions 900 can individually inject purge gas regardless of whether the right rear injection holes 555 of other storage regions 900 inject purge gas.

A plurality of second valves 735 may be provided in the communication sections between the plurality of right vertical supply passages 736 and each of the plurality of rear supply chambers 731.

The plurality of second valves 735 function to supply the purge gas to each of the plurality of rear supply chambers 731 through each of the plurality of right vertical supply passages 736, or to block the supply of the purge gas.

Through the plurality of second valves 735 as described above, the supply of purge gas to each of the plurality of rear supply chambers 731 arranged vertically can be individually controlled.

Accordingly, the plurality of rear injection holes 535 provided on the rear side of each of the plurality of storage regions 900 can individually inject purge gas regardless of whether the rear injection holes 535 of other storage regions 900 inject purge gas.

As shown in FIG. 12, the wafer storage container 10 according to the first embodiment of the present invention injects purge gas through the plurality of left injection holes 515 provided on the left wall 510 of each of the plurality of storage regions 900, the plurality of left rear injection holes 545 provided on the left rear wall 540, the plurality of rear injection holes 535 provided on the rear wall 530, and the plurality of right rear injection holes 555 provided on the right rear wall 550. In addition, each of the plurality of storage regions 900 removes the purge gas and fumes of the wafer through the plurality of right exhaust holes 525 provided on the right wall 520.

That is, in the wafer storage container 10 according to the first embodiment of the present invention, purge gas is injected from the left side, the left rear side, the rear side, and the right rear side of each of the plurality of storage regions 900, and the purge gas and fumes of the wafer are exhausted from the right side of each of the plurality of storage regions 900.

The aforementioned first to fourth valves 715, 735, 745, 755 and the exhaust valve 725 may be controlled to open and close by the control unit 800.

The control unit 800 may be provided to be coupled to the rear of the rear wall 530 so as to be located at the rear of the wafer storage container 10.

Each of the plurality of storage regions 900 of the storage chamber 100 may be provided with a humidity sensor and a gas sensor.

The control unit 800 may measure the humidity and contamination level of each of the plurality of storage regions through the plurality of humidity sensors and the plurality of gas sensors.

In addition, each of the plurality of storage regions 900 may be provided with a position sensor for measuring whether a wafer is supported on the support plate 200.

The control unit 800 may determine whether a wafer is supported and stored on the support plate 200 of the storage region 900 through the position sensor. Accordingly, the control unit 800 may control the plurality of first to fourth valves 715, 735, 745, 755 to individually inject purge gas only into the storage region 900 where the wafer is to be stored among the plurality of storage regions 900.

In addition, the control unit 800 may control the plurality of first to fourth valves 715, 735, 745, 755 inside the storage region 900 to inject purge gas only from a desired side.

In addition, the control unit 800 may control the exhaust valve 725 of a desired storage region 900 among the plurality of storage regions 900 to exhaust the purge gas and fumes of the storage region 900.

For example, when wafers are stored only in the support plate 200 of the first storage region 900 from the bottom, the support plate 200 of the fifth storage region 900 from the bottom, and the support plate 200 of the tenth storage region 900 from the bottom among the 30 storage regions 900, the control unit 800 controls the first to fourth valves 715, 735, 745, 755 and the exhaust valve 725 provided in the first storage region 900 from the bottom, the fifth storage region 900 from the bottom, and the tenth storage region 900 from the bottom to perform the injection and exhaust of purge gas.

The pressure of the purge gas supplied from the external purge gas supply unit 50 to the lower plate 630 of the wafer storage container 10 can be controlled to change proportionally to the number of storage regions 900 among the plurality of storage regions 900 in which wafers are stored.

The pressure of the purge gas supplied from the external purge gas supply unit 50 to the lower plate 630 of the wafer storage container 10 can be the product of the injection pressure per storage region preset in the control unit 800 and the number of storage regions 900 in which wafers are stored. That is, the relationship 'Pressure of purge gas (P) supplied from the external purge gas supply unit 50 to the lower plate 630 of the wafer storage container 10=Injection pressure (Pslot) per storage region 900×Number of storage regions 900 in which wafers are stored' is satisfied.

For example, if the injection pressure (Pslot) per storage region 900 preset in the control unit 800 is '10 LPM' (the injection pressure (Pslot) per storage region 900 is the injection pressure required for one storage region 900), and wafers are stored in a total of three storage regions, namely the first storage region 900 from the bottom, the fifth storage region 900 from the bottom, and the tenth storage region 900 from the bottom among the 30 storage regions 900, the pressure (P) of the purge gas supplied to the lower plate 630 of the wafer storage container 10 from the external purge gas supply unit 50 is '10 LPM×3=30 LPM'.

The pressure of the external purge gas supply unit 50 can be adjusted by the flow control device 60, and the flow control device 60 is controlled by the control unit 800.

The wafer storage container 10 according to the first embodiment of the present invention has the following effects.

The storage chamber 100 can be divided into a plurality of storage regions 900 by the blocking plates 300, allowing the injection and exhaust of purge gas to be performed individually in the plurality of storage regions 900. Therefore, purging can be performed only in the regions where wafers are stored or in desired regions, saving the consumption of purge gas.

The interior of the storage chamber is divided into a plurality of storage regions 900 in the vertical direction by the blocking plates 300.

Since the storage regions 900 are restricted from vertical flow of purge gas by the blocking plates 300, the purge gas is individually injected or exhausted into each of the plurality of storage regions 900, enabling individual purging of wafers.

Additionally, each of the plurality of storage regions 900 is provided with injection holes on the walls, allowing purge gas to be individually injected in the horizontal direction as well.

Therefore, purge gas can be individually injected in multiple directions within one storage region 900.

By dividing the storage chamber 100 into independent and individual storage regions 900, the diffusion of purge gas into surplus spaces inside the storage chamber 100 can be prevented. Thus, the reaction of wafers can be suppressed by supplying a minimal amount of purge gas.

By individually performing exhaust only in the desired sections among the plurality of storage regions 900, turbulence formed at the front opening where wafers enter can be minimized, improving the efficiency of airflow control.

By injecting purge gas only into the desired sections among the plurality of storage regions 900, the humidity of the wafers can be controlled. Therefore, it is possible to effectively prevent wafers from being damaged by moisture while saving purge gas.

Wafer Storage Container 10' According to the Second Embodiment of the Present Invention Hereinafter, the wafer storage container 10' according to the second embodiment of the present invention will be described with reference to FIGS. 13 and 14.

Figure 13:
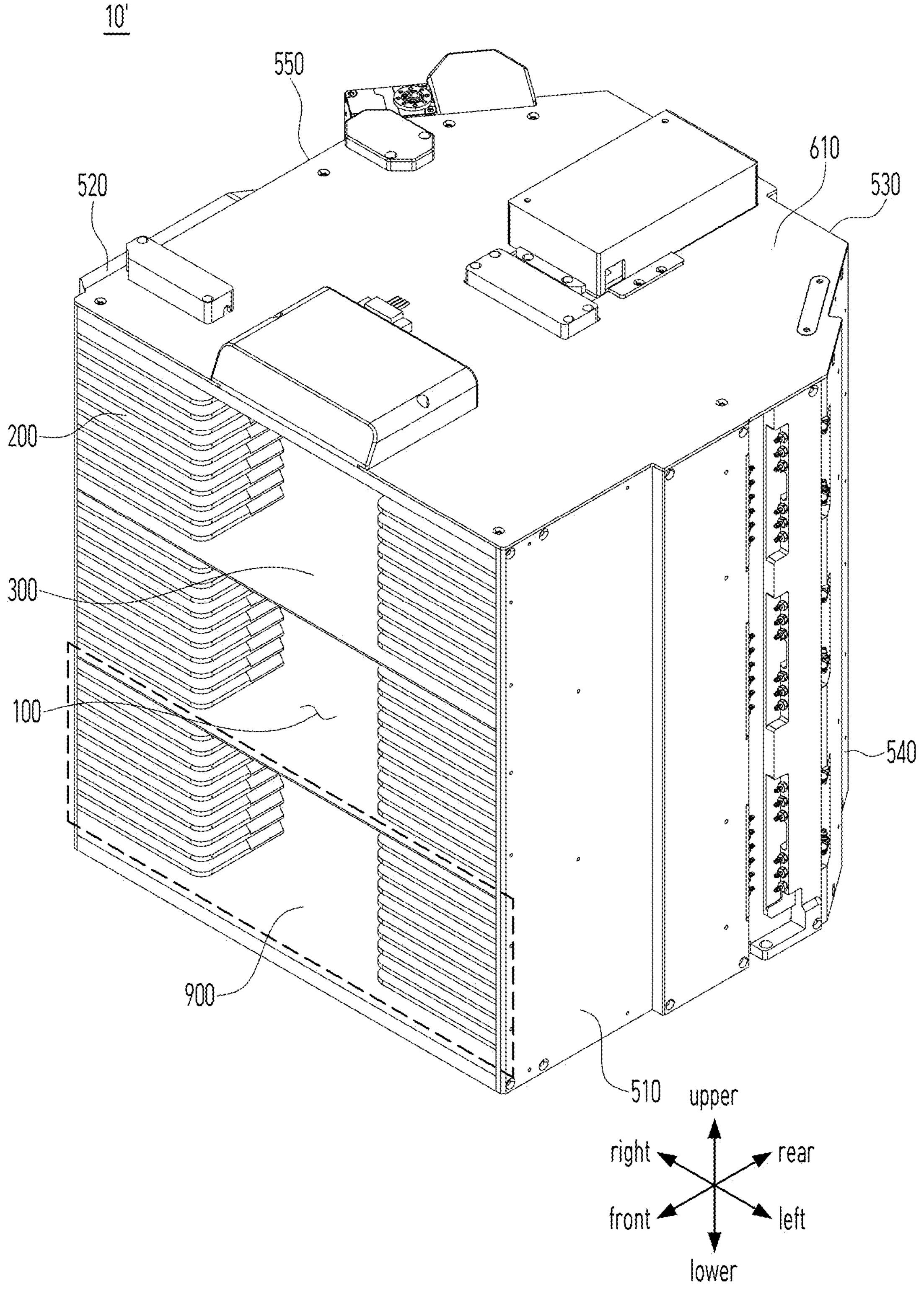
FIG. 13 is a perspective view of a wafer storage container according to the second embodiment of the present invention.
Figure 14:
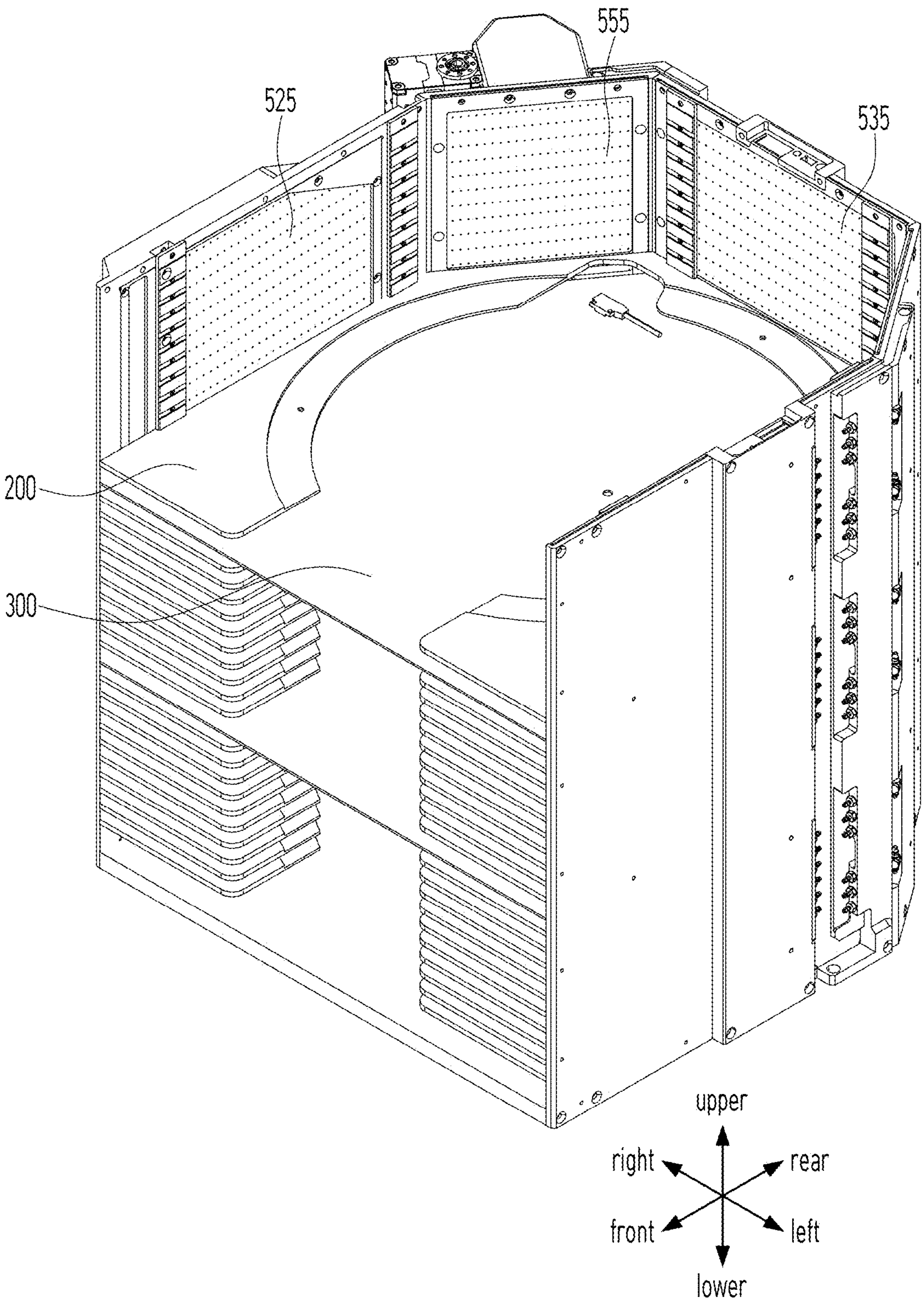
FIG. 14 is a perspective view of FIG. 13 with the top plate, some support plates, and some blocking plates removed.

FIG. 13 is a perspective view of the wafer storage container 10' according to the second embodiment of the present invention, and FIG. 14 is a perspective view of FIG. 13 with the upper plate, some support plates, and some blocking plates removed.

The wafer storage container 10' according to the second embodiment of the present invention may comprise a storage chamber 100 in which a plurality of wafers are stored through the front opening 110, a plurality of support plates 200 provided in the vertical direction inside the storage chamber 100 to support each of the plurality of wafers, and at least one or more blocking plates 300 provided between the plurality of support plates 200. The storage chamber 100 is divided into a plurality of storage regions 900 in the vertical direction by the blocking plates 300, and at least one of the plurality of storage regions 900 has two or more support plates 200.

The wafer storage container 10' according to the second embodiment of the present invention differs from the wafer storage container 10 according to the first embodiment of the present invention in that two or more support plates 200 can be located in the plurality of storage regions 900 individually divided by the blocking plates 300. Therefore, the other components are the same, and redundant descriptions are omitted.

The wafer storage container 10' according to the second embodiment of the present invention is provided with 30 support plates 200 and 2 blocking plates 300.

Among the 2 blocking plates 300, the blocking plate 300 located at the lower part is positioned above the 10th support plate 200 from the bottom, and the other blocking plate 300, that is, the blocking plate 300 located at the upper part, is positioned above the 20th support plate 200 from the bottom.

Three storage regions 900 are formed by the 2 blocking plates 300.

Among the 3 storage regions 900, the storage region 900 located at the lower part is divided by the lower plate 630 and the blocking plate 300 located at the lower part among the 2 blocking plates 300. That is, among the 3 storage regions 900, the storage region 900 located at the lower part has the lower plate 630 forming the bottom surface of the storage region 900, and the blocking plate 300 located at the lower part among the 2 blocking plates 300 forming the top surface of the storage region 900. This storage region 900 is provided with 10 support plates 200, and 10 wafers are stored respectively.

Among the 3 storage regions 900, the storage region 900 located at the center is divided by the 2 blocking plates 300. That is, among the 3 storage regions 900, the storage region 900 located at the center has the blocking plate 300 located at the lower part among the 2 blocking plates 300 forming the bottom surface of the storage region 900, and the blocking plate 300 located at the upper part among the 2 blocking plates 300 forming the top surface of the storage region 900. This storage region 900 is provided with 10 support plates 200, and 10 wafers are stored respectively.

Among the 3 storage regions 900, the storage region 900 located at the upper part is divided by the blocking plate 300 located at the upper part among the 2 blocking plates 300 and the upper plate 610. That is, among the 3 storage regions 900, the storage region 900 located at the upper part has the blocking plate 300 located at the upper part among the 2 blocking plates 300 forming the bottom surface of the storage region 900, and the upper plate 610 forming the top surface of the storage region 900. This storage region 900 is provided with 10 support plates 200, and 10 wafers are stored respectively.

Each of the 3 storage regions 900 is provided with a plurality of injection holes 580 and a plurality of exhaust holes 590.

The inner side surface of one storage region 900 is provided with a left wall 510, a right wall 520, a rear wall 530, a left rear wall 540, and a right rear wall 550.

Each of the left wall 510, right wall 520, rear wall 530, left rear wall 540, and right rear wall 550 is provided with a left chamber 511, a right chamber 521, a rear chamber 531, a left rear chamber 541, and a right rear chamber.

In this case, one storage region 900 may be provided with one left chamber 511, one right chamber 521, one rear chamber 531, one left rear chamber 541, and one right rear chamber, or may be provided with two or more of them.

However, even when the number of left chambers 511, right chambers 521, rear chambers 531, left rear chambers 541, and right rear chambers is one or two or more, it is preferable that purge gas is injected through a single line rather than multiple lines. Therefore, each of the 3 storage regions 900 is supplied with purge gas through at least one of the left chamber 511, right chamber 521, rear chamber 531, left rear chamber 541, and right rear chamber by 3 individual purge gas lines, and purge gas can be injected through the injection holes provided in at least one of the left chamber 511, right chamber 521, rear chamber 531, left rear chamber 541, and right rear chamber.

As described above, the wafer storage container 10' according to the second embodiment of the present invention comprises one or two or more, that is, a plurality of support plates 200 in one storage region 900, and even if a plurality of support plates 200 are provided, purge gas is injected through one line, so that the injection of purge gas can be individually controlled for each storage region 900 regardless of the number of wafers stored in the storage region 900. Therefore, compared to the first embodiment described above, the individual control of purge gas can be implemented more simply.

Each of the three storage regions 900 can exhaust purge gas and fumes through exhaust holes provided in at least one or more of the left chamber 511, right chamber 521, rear chamber 531, left rear chamber 541, and right rear chamber by three separate exhaust lines. Therefore, even in the case of exhaust in the storage region 900, the exhaust of purge gas and fumes can be individually controlled for each storage region 900 regardless of the number of wafers stored in the storage region 900.

Unlike the second embodiment described above, the number of support plates 200 provided in the plurality of storage regions 900 may be different from each other.

For example, when 30 support plates 200 are provided, three blocking plates 300 may be located respectively above the fifth support plate 200 from the bottom, above the sixth support plate 200 from the bottom, and above the twenty-fourth support plate 200 from the bottom, thereby dividing four storage regions 900. In this case, the lowermost storage region 900 is provided with five support plates 200, the storage region 900 above it is provided with one support plate 200, the storage region 900 above it is provided with eighteen support plates 200, and the uppermost storage region 900 is provided with six support plates 200, so that the number of support plates 200 provided in the plurality of storage regions 900 may be different from each other.

The support plate 200 described above can be applied not only to the plate-shaped support plate 200 but also to other types of supports for supporting wafers.

As described above, although the preferred embodiments of the present invention have been described with reference to the above, those skilled in the art can make various modifications or changes to the present invention without departing from the spirit and scope of the present invention as set forth in the following claims.

What is claimed is:

1. A wafer storage container comprising:

a storage chamber in which a plurality of wafers are stored through a front opening;

a plurality of support plates arranged in a vertical direction inside the storage chamber, each of the plurality of support plates supporting a corresponding one of the plurality of wafers; and at least one blocking plate arranged in the vertical direction inside the storage chamber, wherein each blocking plate is located between two vertically adjacent support plates among the plurality of support plates, wherein the plurality of support plates and the at least one blocking plate are alternately arranged in the vertical direction, wherein the storage chamber is divided into a plurality of storage regions in the vertical direction by the at least one blocking plate, and one support plate is located in each of the plurality of storage regions.

2. The wafer storage container according to claim 1, wherein each of the plurality of storage regions is provided with a plurality of injection holes for injecting purge gas into each of the plurality of storage regions, and a plurality of exhaust holes for exhausting the purge gas injected into each of the plurality of storage regions, and the plurality of injection holes and the plurality of exhaust holes are provided on on inner side surfaces of the storage chamber, but are not located on the same one of the inner side surfaces.

3. The wafer storage container according to claim 1, wherein a flow of purge gas in the vertical direction is restricted in the plurality of storage regions.

4. The wafer storage container according to claim 1, wherein for each support plate of the plurality of support plates, a distance between the support plate and a blocking plate located above the support plate is shorter than a distance between the support plate and a blocking plate located below the support plate.

5. The wafer storage container according to claim 4, further comprising:

a plurality of connecting parts vertically connecting the plurality of support plates and the at least one blocking plate, wherein each of the plurality of connecting parts includes:

a connecting part body;

support plate grooves provided in a plurality in the vertical direction on an inner side surface of the connecting part body, into which an outer side surface of the support plate is inserted; and blocking plate grooves provided in a plurality in the vertical direction on the inner side surface of the connecting part body, into which an outer side surface of each blocking plate is inserted.

6. The wafer storage container according to claim 5, wherein the plurality of connecting parts are coupled to an inner side surface of the storage chamber.

7. The wafer storage container according to claim 6, wherein each of the plurality of storage regions is provided with a plurality of injection holes for injecting purge gas into each of the plurality of storage regions, and the plurality of injection holes are provided on the inner side surface of the storage chamber and located between the support plate and the blocking plate located above the support plate.

8. The wafer storage container according to claim 5, wherein the storage chamber includes a left side surface, a left rear surface, a rear surface, a right side surface, and a right rear surface, the outer side surface of each support plate and the outer side surface of each blocking plate are in contact with the left side surface, the left rear surface, the rear surface, the right side surface, and the right rear surface of the storage chamber, and an area of each of the plurality of blocking plates is formed to be larger than an area of each of the plurality of support plates.

9. A wafer storage container comprising:

a storage chamber in which a plurality of wafers are stored through a front opening;

a plurality of support plates arranged in a vertical direction inside the storage chamber, each of the plurality of support plates supporting a corresponding one of the plurality of wafers; and at least one blocking plate arranged in the vertical direction inside the storage chamber, wherein each blocking plate is located between adjacent groups of the plurality of support plates, wherein the storage chamber is divided into a plurality of storage regions in a vertical direction by the at least one blocking plate, and two or more support plates are located in each of the plurality of storage regions.

* * * * *